(12) United States Patent
Schmid et al.

(10) Patent No.: US 8,969,207 B2
(45) Date of Patent: Mar. 3, 2015

(54) METHODS OF FORMING A MASKING LAYER FOR PATTERNING UNDERLYING STRUCTURES

(71) Applicant: GLOBALFOUNDRIES Inc., Grand Cayman (KY)

(72) Inventors: Gerard M. Schmid, Rensselaer, NY (US); Jeremy A. Wahl, Delmar, NY (US); Richard A. Farrell, Albany, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/798,690

(22) Filed: Mar. 13, 2013

(65) Prior Publication Data
US 2014/0273473 A1 Sep. 18, 2014

(51) Int. Cl.
*H01L 21/311* (2006.01)
*H01L 23/48* (2006.01)
*H01L 21/308* (2006.01)

(52) U.S. Cl.
CPC .................................. *H01L 21/308* (2013.01)
USPC ............ 438/703; 257/E21.257; 257/E47.005; 257/E21.214; 257/E21.158; 257/774

(58) Field of Classification Search
CPC ... H01L 21/0274; H01L 21/308; H01L 21/26; H01L 21/31; H01L 21/02
USPC .................... 257/E21.575, E21.317, E21.471, 257/E21.475, E21.347; 438/118, 106, 438/455–458, 612–615, 694–703, 781, 57
See application file for complete search history.

(56) References Cited

U.S. PATENT DOCUMENTS

| | | |
|---|---|---|
| 6,890,624 B1 | 5/2005 | Kambe et al. |
| 7,118,900 B2 | 10/2006 | Seul et al. |
| 7,161,168 B2 | 1/2007 | Heath et al. |
| 7,521,094 B1 | 4/2009 | Cheng et al. |
| 7,713,758 B2 | 5/2010 | Yamashita et al. |
| 7,906,775 B2 | 3/2011 | Heath et al. |
| 7,923,373 B2 | 4/2011 | Sandhu |
| 8,059,350 B2 | 11/2011 | Albrecht et al. |
| 8,119,017 B2 | 2/2012 | Albrecht et al. |
| 8,133,341 B2 | 3/2012 | Nealey et al. |
| 8,133,534 B2 | 3/2012 | Stoykovich et al. |
| 8,168,284 B2 | 5/2012 | Nealey et al. |
| 8,226,838 B2 | 7/2012 | Cheng et al. |
| 8,257,598 B2 | 9/2012 | Albrecht et al. |
| 8,263,002 B1 | 9/2012 | Chow et al. |
| 8,287,957 B2 | 10/2012 | Nealey et al. |
| 8,304,493 B2 | 11/2012 | Millward et al. |
| 8,336,003 B2 | 12/2012 | Cheng et al. |
| 2009/0035668 A1 | 2/2009 | Breyta et al. |
| 2010/0294740 A1 | 11/2010 | Cheng et al. |

(Continued)

*Primary Examiner* — Amar Movva
*Assistant Examiner* — Sheikh Maruf
(74) *Attorney, Agent, or Firm* — Amerson Law Firm, PLLC

(57) ABSTRACT

One illustrative method disclosed herein includes forming a patterned hard mask layer comprised of a plurality of discrete openings above a structure, wherein the patterned hard mask layer is comprised of a plurality of intersecting line-type features, forming a patterned etch mask above the patterned hard mask layer that exposes at least one, but not all, of the plurality of discrete openings, and performing at least one etching process through the patterned etch mask and the at least one exposed opening in the patterned hard mask layer to define an opening in the structure.

28 Claims, 22 Drawing Sheets

(56) References Cited

U.S. PATENT DOCUMENTS

| | | |
|---|---|---|
| 2010/0316849 A1 | 12/2010 | Millward et al. |
| 2011/0033786 A1 | 2/2011 | Sandhu |
| 2012/0189824 A1 | 7/2012 | Nealey et al. |
| 2012/0202017 A1 | 8/2012 | Nealey et al. |
| 2012/0208361 A1* | 8/2012 | Ha .................. 438/597 |
| 2012/0235211 A1* | 9/2012 | Sills et al. ............. 257/211 |
| 2012/0322224 A1* | 12/2012 | Jeong et al. ............. 438/382 |
| 2012/0331428 A1 | 12/2012 | Cheng et al. |
| 2013/0337652 A1* | 12/2013 | Sun et al. ............. 438/703 |
| 2014/0131312 A1* | 5/2014 | Chang et al. ............. 216/49 |

\* cited by examiner

METHODS OF FORMING A MASKING LAYER FOR PATTERNING UNDERLYING STRUCTURES

BACKGROUND OF THE INVENTION

1. Field of the Invention

Generally, the present disclosure relates to the manufacture of semiconductor devices, and, more specifically, to various methods of forming a masking layer for use in patterning underlying structures.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To improve the operating speed of field effect transistors (FETs), and to increase the density of FETs on an integrated circuit device, device designers have greatly reduced the physical size of FETs over the past decades. More specifically, the channel length of FETs has been significantly decreased, which has resulted in improving the switching speed of FETs and the overall functionality of the circuit. Further scaling (reduction in size) of the channel length of transistors is anticipated in the future. While this ongoing and continuing decrease in the channel length of transistor devices has improved the operating speed of the transistors and integrated circuits that are formed using such transistors, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices.

Typically, due to the large number of circuit elements and the required complex layout of modern integrated circuits, the electrical connections of the individual circuit elements cannot be established within the same level on which the circuit elements, such as transistors, are manufactured. Rather, modern integrated circuit products have multiple so-called metallization layer levels that, collectively, contain the "wiring" pattern for the product, i.e., the conductive structures that provide electrical connection to the transistors and the circuits, such as conductive vias and conductive metal lines. In general, the conductive metal lines are used to provide intra-level (same level) electrical connections, while interlevel (between levels) connections or vertical connections are referred to as vias. In short, the vertically oriented conductive via structures provide the electrical connection between the various stacked metallization layers. Accordingly, the electrical resistance of such conductive structures, e.g., lines and vias, becomes a significant issue in the overall design of an integrated circuit product, since the cross-sectional area of these elements is correspondingly decreased, which may have a significant influence on the effective electrical resistance and overall performance of the final product or circuit.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used aluminum for the conductive lines and vias. The use of low-k dielectric materials tends to improve the signal-to-noise ratio (S/N ratio) by reducing cross-talk as compared to other dielectric materials with higher dielectric constants. However, the use of such low-k dielectric materials can be problematic as they tend to be less resistant to metal migration as compared to some other dielectric materials.

Copper is a material that is difficult to directly etch using traditional masking and etching techniques. Thus, conductive copper structures, e.g., conductive lines or vias, in modern integrated circuit devices are typically formed using known single or dual damascene techniques. In general, the damascene technique involves (1) forming a trench/via in a layer of insulating material, (2) depositing one or more relatively thin barrier or liner layers (e.g., TiN, Ta, TaN), (3) forming copper material across the substrate and in the trench/via, and (4) performing a chemical mechanical polishing process to remove the excess portions of the copper material and the barrier layer(s) positioned outside of the trench/via to define the final conductive copper structure. The copper material is typically formed by performing an electrochemical copper deposition process after a thin conductive copper seed layer is deposited by physical vapor deposition on the barrier layer.

Photolithography is one of the basic processes used in manufacturing integrated circuit products. At a very high level, photolithography involves: (1) forming a layer of light or radiation-sensitive material, such as a photoresist material, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the final circuit layout (design) on the integrated circuit product. Historically, the pitches employed in integrated circuit products were large enough such that a desired pattern could be formed using a single patterned photoresist masking layer. However, in recent years, device dimensions and pitches have been reduced in size to the point where existing photolithography tools, e.g., 193 nm wavelength photolithography tools, cannot form a single patterned mask layer with all of the features of the overall target pattern. That is, existing 193 mm wavelength photolithography tools and techniques are limited to printing patterns having a pattern pitch above 70 nm using a single layer of photoresist. Accordingly, device designers have resorted to techniques that involve performing multiple exposures to define a single target pattern in a layer of material. One such technique is generally referred to as double patterning or double patterning technology (DPT). In general, double patterning is an exposure method that involves splitting (i.e., dividing or separating) a dense overall target circuit pattern into two separate, less-dense patterns. The simplified, less-dense patterns are then printed separately utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively enables the printing of even smaller features than would otherwise be possible using a single mask using existing photolithography tools. There are several double patterning techniques employed by semiconductor manufacturers.

While such double patterning techniques can enable the printing of features with pitches less than can be formed using a single layer of patterned photoresist material, such double patterning processes are time-consuming and require a great deal of precision in terms of overlay accuracy. So-called sidewall image transfer techniques can also be employed to form patterns having reduced pitches, but such sidewall image transfer techniques are time-consuming and expensive.

The present disclosure is directed to various methods of forming a masking layer for use in patterning underlying structures that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a masking layer for use in patterning underlying structures. One illustrative method disclosed herein includes forming a patterned hard mask layer comprised of a plurality of discrete openings above a structure, wherein the patterned hard mask layer is comprised of a plurality of intersecting line-type features, forming a patterned etch mask above the patterned hard mask layer that exposes at least one, but not all, of the plurality of discrete openings, and performing at least one etching process through the patterned etch mask and the at least one exposed opening in the patterned hard mask layer to define an opening in the structure.

Another illustrative method disclosed herein includes forming a patterned hard mask layer above a structure, wherein the patterned hard mask layer is comprised of a first plurality of line-type features that intersect a second plurality of line-type features to thereby define a plurality of discrete openings, and wherein the first plurality of line-type features and the second plurality of line-type features are made of different materials, forming a patterned etch mask above the patterned hard mask layer that exposes at least one, but not all, of the plurality of discrete openings, and performing at least one etching process through the patterned etch mask and the at least one exposed opening in the patterned hard mask layer to define an opening in the structure.

Yet another illustrative method disclosed herein includes forming a patterned hard mask layer above a structure, wherein the patterned hard mask is comprised of a plurality of intersecting line-type features that define a plurality of discrete openings having a substantially rectangular configuration, forming a patterned etch mask above the patterned hard mask layer that exposes at least one, but not all, of the plurality of discrete openings, and performing at least one etching process through the patterned etch mask and the at least one exposed opening in the patterned hard mask layer to define an opening in the structure.

Yet another illustrative method disclosed herein includes forming a first layer of insulating material, forming an etch stop layer above the first layer of insulating material, forming a second layer of insulating material above the etch stop layer, forming a patterned hard mask layer comprised of a plurality of discrete openings above the second layer of insulating material, forming a first patterned etch mask above the patterned hard mask layer that exposes at least one, but not all, of the plurality of discrete openings, and performing at least one first etching process through the patterned etch mask and the at least one exposed opening in the patterned hard mask layer to define an opening in the second layer of insulating material, wherein the at least one opening in the second layer of insulating material exposes the etch stop layer. In this example, the method includes the additional steps of removing the first patterned etch mask, forming a second patterned etch mask above the patterned hard mask layer that exposes at least one, but not all, of the plurality of discrete openings, performing at least one second etching process to remove portions of the patterned hard mask layer, after performing the at least one second etching process, performing at least one third etching process to remove exposed portions of the etch stop layer and thereby expose portions of the first layer of insulating material, performing at least one fourth etching process to remove exposed portions of the first and second layers of insulating material to thereby define at least one trench in the second layer of insulating material and at least one opening in the first layer of insulating material, and forming a conductive structure in each of the at least one trench and the at least one opening.

BRIEF DESCRIPTION OF THE DRAWINGS

The disclosure may be understood by reference to the following description taken in conjunction with the accompanying drawings, in which like reference numerals identify like elements, and in which.

Figure 1A:
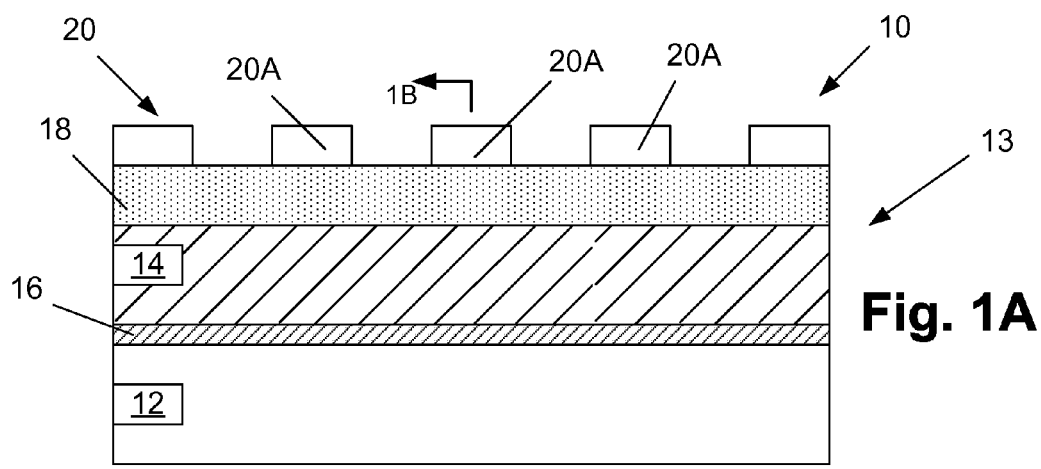
FIGS. 1-13 depict various novel methods disclosed herein of methods of forming a masking layer for use in patterning underlying structures on an integrated circuit product, such as conductive lines and conductive vias.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a masking layer for use in patterning underlying structures. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASIC's, logic devices, memory devices, etc. With reference to the attached drawings, various illustrative embodiments of the methods disclosed herein will now be described in more detail.

In general, the presently disclosed inventions are broadly directed to forming a patterned hard mask layer comprised of a plurality of openings above a structure that is to be patterned. Thereafter, some, but not all, of the openings in the patterned hard mask layer are covered or masked and an etching process is performed on the underlying structure through the exposed openings in the patterned hard mask layer to define openings or recesses in the underlying structure. In one illustrative example, the patterned hard mask disclosed herein is comprised of a plurality of intersecting line-type features that intersect one another at approximately ninety degrees, thereby defining a plurality of substantially rectangular shaped openings in the patterned hard mask layer. The novel methods disclosed herein will be disclosed in the context of forming various conductive structures, e.g., conductive lines and conductive vias, on an integrated circuit product. However, as will be appreciated by those skilled in the art after a complete reading of the present application, the methods disclosed herein may be employed in patterning any type of underlying structure. Thus, the inventions disclosed herein should not be considered to be limited to patterning any particular type of underlying structure. Additionally, the attached drawings include various cross-sectional views and plan views of an illustrative integrated circuit product or device 10. In general, drawings that contain the "C" designation, e.g., FIG. 1C, are plan views of the device 10. The cross-sectional views in the attached drawings are taken where indicated.

Figure 1B:
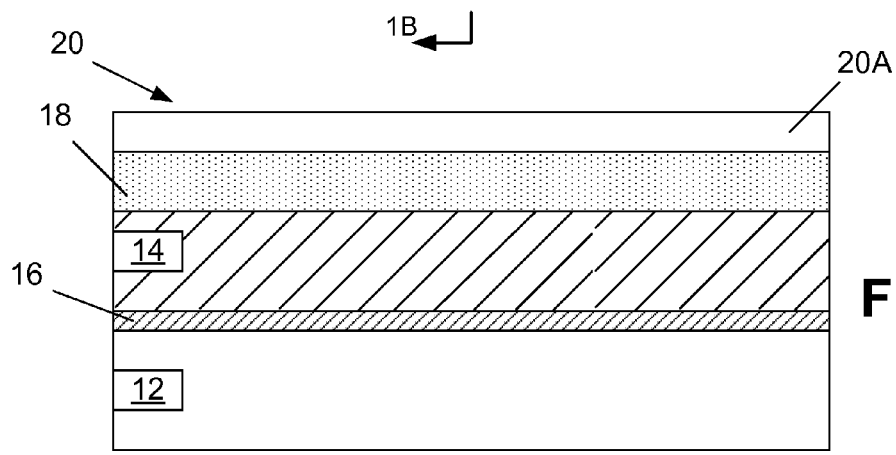
Figure 1C:
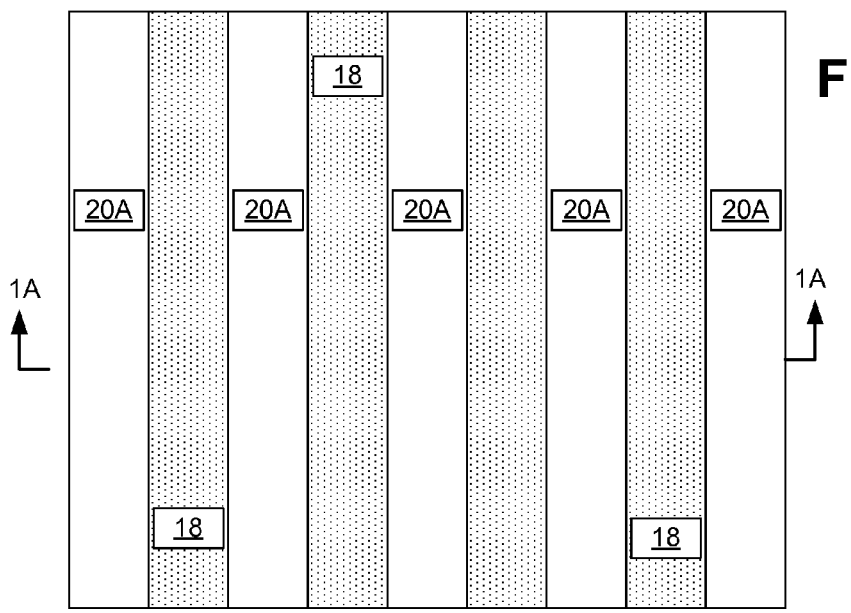

FIGS. 1A-1C depict the integrated circuit device 10 at an early stage of manufacturing. The device 10 may be formed above a semiconductor substrate (not shown). The substrate may have a variety of configurations, such as a bulk substrate configuration, an SOI (silicon-on-insulator) configuration, and it may be made of materials other than silicon. Thus, the terms "substrate" or "semiconductor substrate" should be understood to cover all semiconducting materials and all forms of such materials. The device 10 may be any type of integrated circuit device that employs any type of a conductive structure, such as a conductive line or via, commonly found on integrated circuit devices.

With continuing reference to FIGS. 1A-1C, in this depicted example, the integrated circuit product 10 is comprised of a first layer of insulating material 12, a second layer of insulating material 14 and an illustrative etch stop layer 16 positioned between the insulating material layers 12, 14. In one embodiment, the insulating material layers 12, 14 and the conductive structures that will be formed therein, as described more fully below, may all be considered to be part of a metallization layer 13 that may be located at any level of the integrated circuit product 10. In one example, the layers of insulating material 12, 14 may be comprised of any insulating material, e.g., silicon dioxide, layers of so-called low-k (k value less than about 3.3) insulating material, while the etch stop layer 16 may be made of a material, such as silicon nitride, that exhibits good etch selectivity relative to the materials used for the insulating material layers 12, 14. The layers 12, 14, and 16 may be formed by performing a variety of known processing techniques, such as a chemical vapor deposition (CVD) process, an atomic layer deposition (ALD) process, a physical vapor deposition (PVD) process, or plasma enhanced versions of such processes, and the thickness of such layers may vary depending upon the particular application.

Also depicted in FIGS. 1A-1C is a first hard mask material layer 18 and a first patterned mask layer 20, comprised of a plurality of line-type features 20A. In the depicted example, the first hard mask material layer 18 is depicted as being a single layer of material. In practice, the first hard mask material layer 18 may be comprised of two or more layers of material depending upon the particular application. The first hard mask material layer 18 may be comprised of a material that exhibits good etch selectivity relative to the layer of insulating material 14. In one illustrative embodiment, the first hard mask material layer 18 may be comprised of, for example, silicon nitride. The first hard mask material layer 18 may be formed by performing a variety of known processing techniques, such as CVD, ALD, etc., and its thickness may vary depending upon the particular application, e.g., 10-40 nm.

In one illustrative embodiment, the first patterned mask layer 20 may be manufactured using a so-called directed self-assembly (DSA) process. In general, the DSA process involves the use of self-assembling block copolymers that arrange themselves in a patterned arrangement of features, e.g., spaced-apart line-type features, spaced-apart cylinder-type features, etc. The manner in which layers of such materials are formed are well known to those skilled in the art. In forming a layer of line-type features, such as the features 20A depicted in FIGS. 1A-1C, the DSA process may be controlled such that the width and pitch of such line-type features may be controlled by controlling the composition of the DSA materials. More importantly, using DSA formation techniques, the line width and pitch of the features 20A in the first patterned mask layer 20 may be formed to substantially smaller dimensions than they could otherwise be formed using traditional photolithography tools and equipment. For example, the pitch of the features 20A may fall within the range of about 10-50 nm using current-day technologies. In one illustrative example, the first patterned mask layer 20 may be formed by spin-coating a structure, such as a wafer or substrate, with the DSA material and then performing an annealing process at a temperature of, for example, about 200-300° C.

Figure 2A:
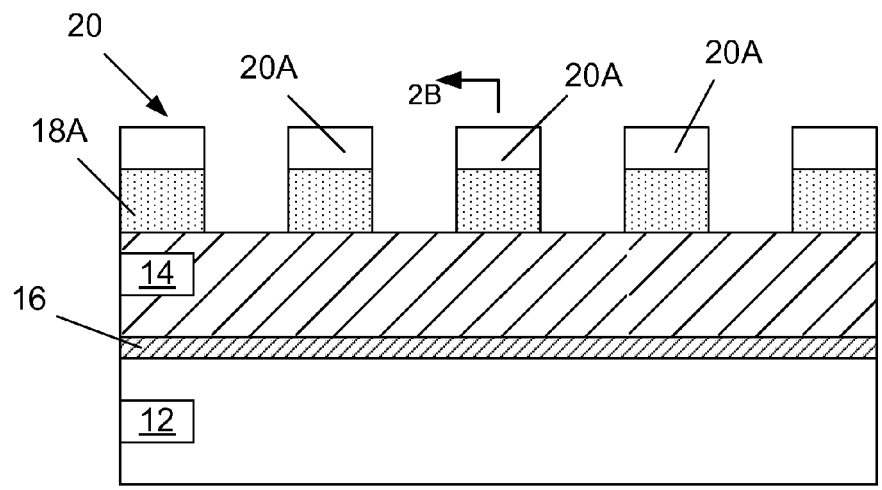
Figure 2B:
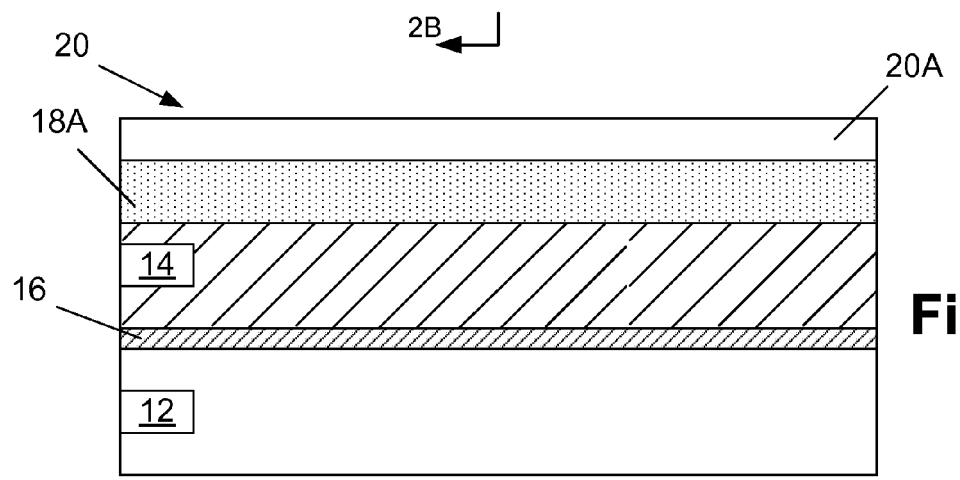
Figure 2C:
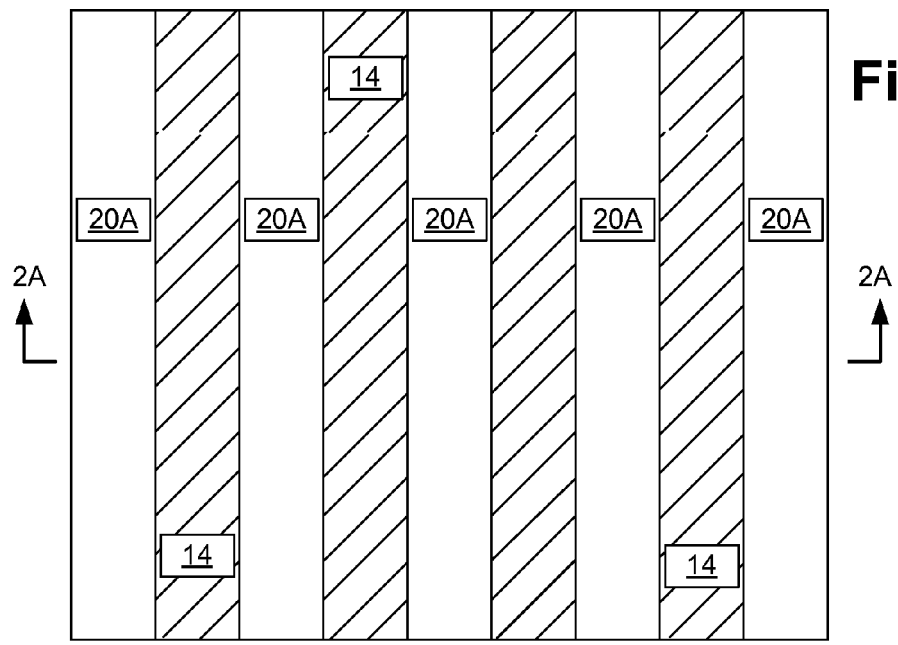

FIGS. 2A-2C depict the device 10 after an etching process has been performed through the first patterned mask layer 20 on the first hard mask material layer 18 to thereby define a first patterned hard mask layer 18A. As depicted, in this example, the first patterned hard mask layer 18A is comprised of a plurality of line-type features.

Figure 3A:
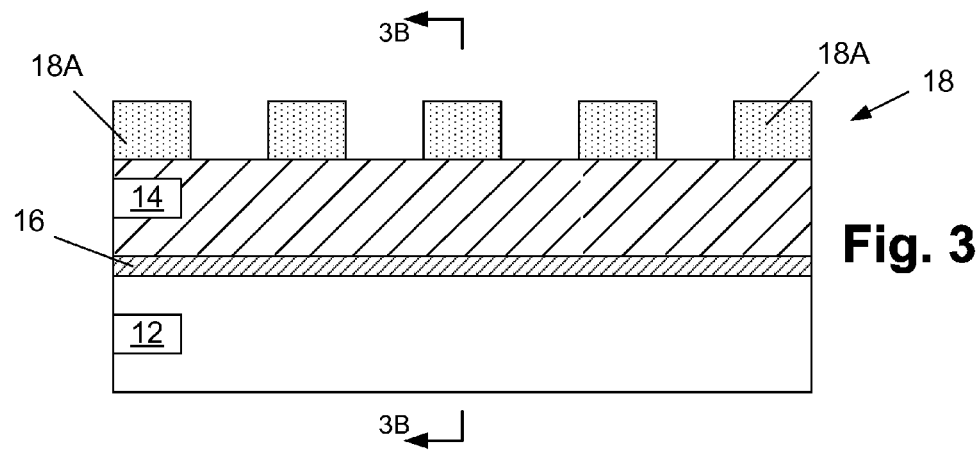
Figure 3B:
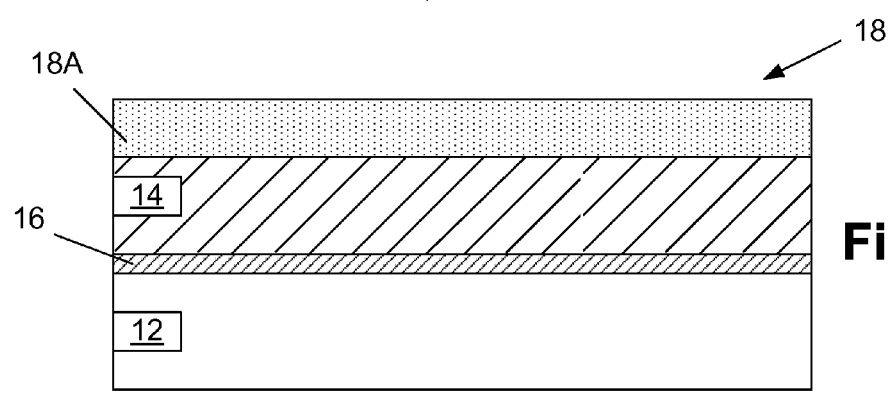
Figure 3C:
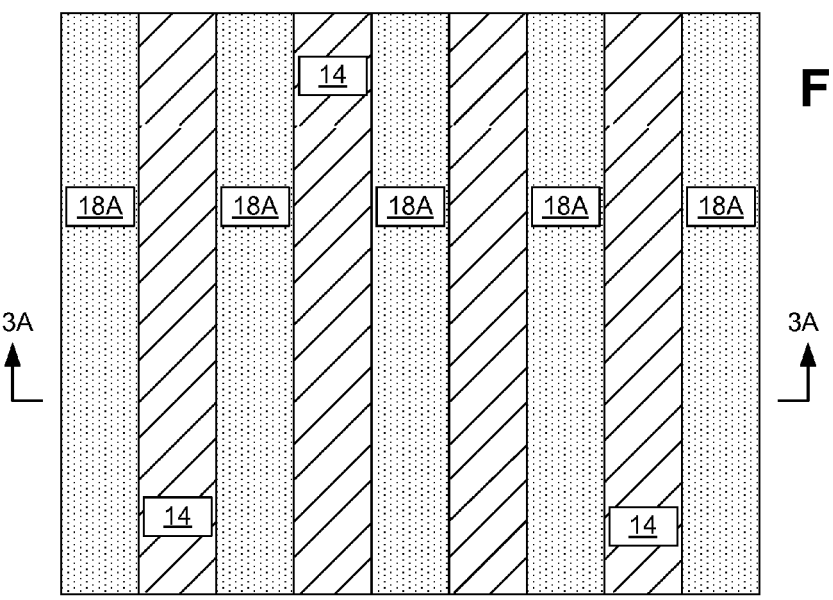

FIGS. 3A-3C depict the product 10 after the first patterned mask layer 20 has been removed. In one illustrative embodiment, the first patterned mask layer 20 may be removed by performing an oxygen-based plasma process.

Figure 4A:
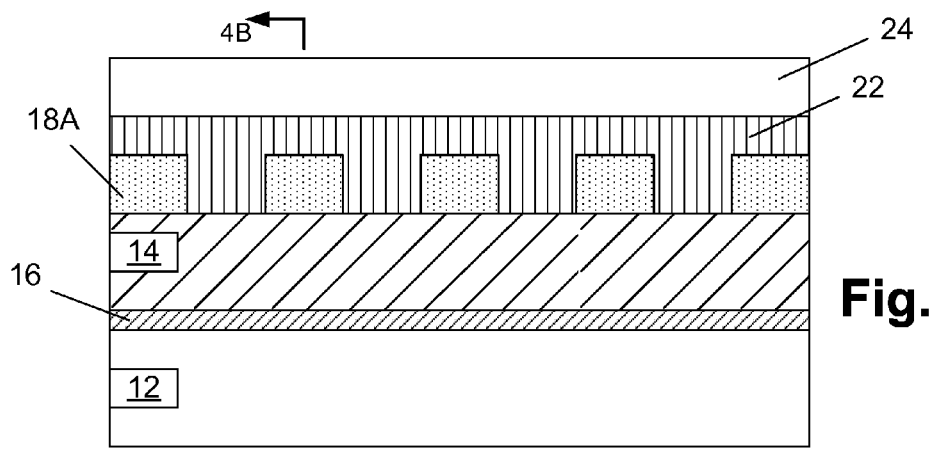
Figure 4B:
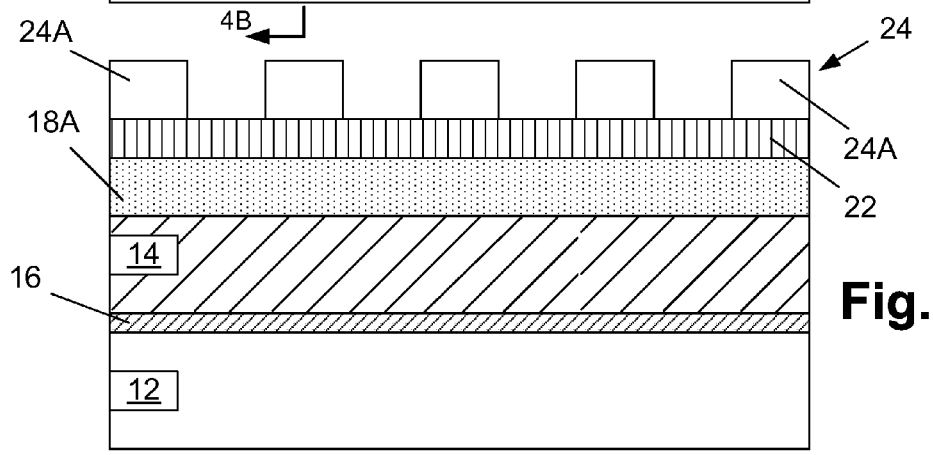
Figure 4C:
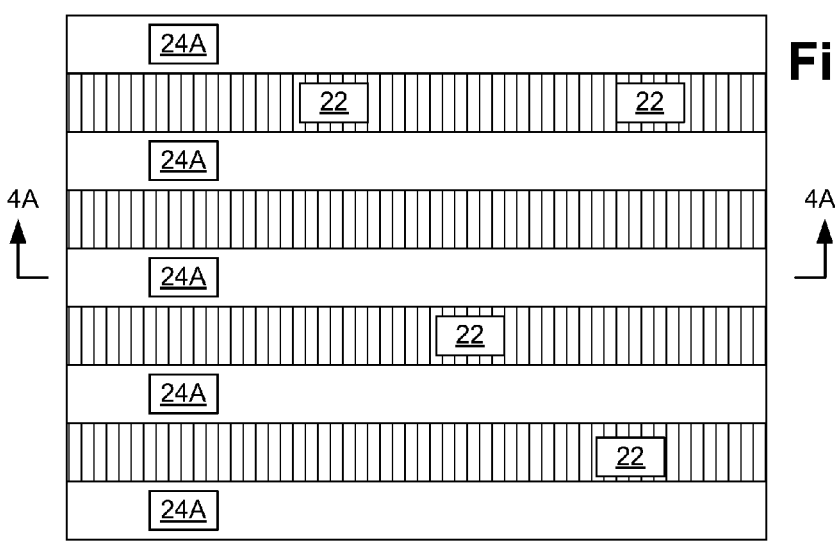
Figure 5A:
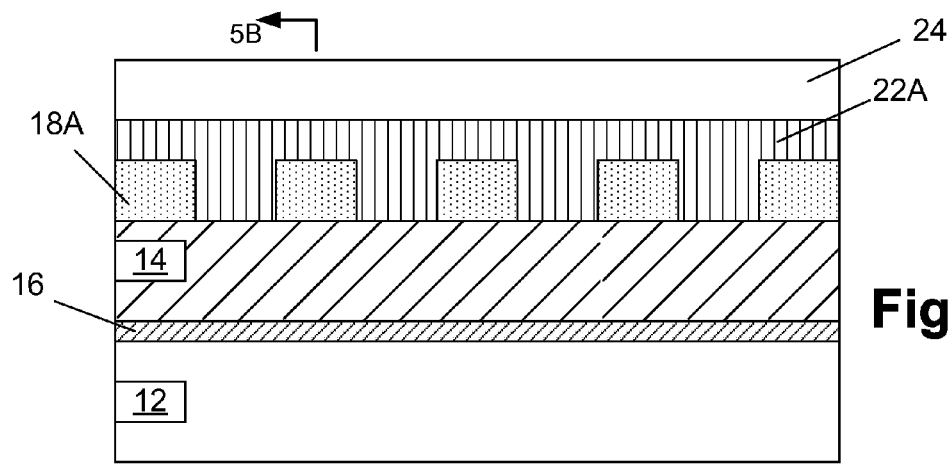
Figure 5B:
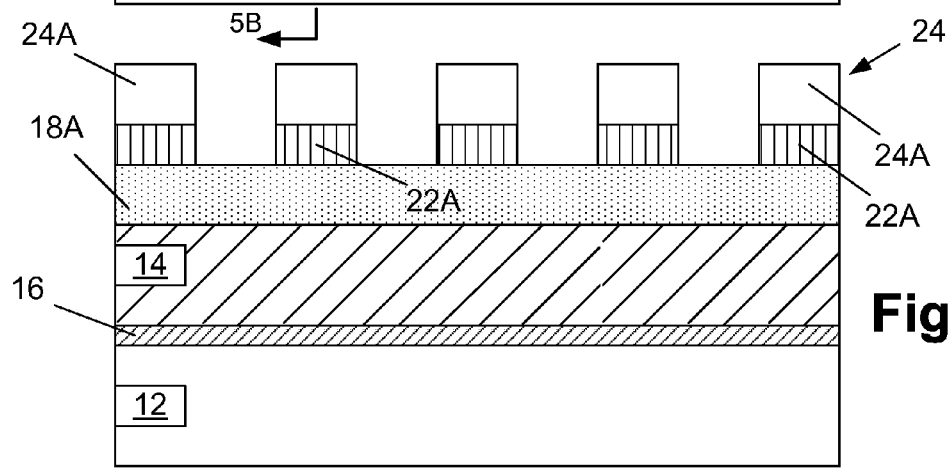
Figure 5C:
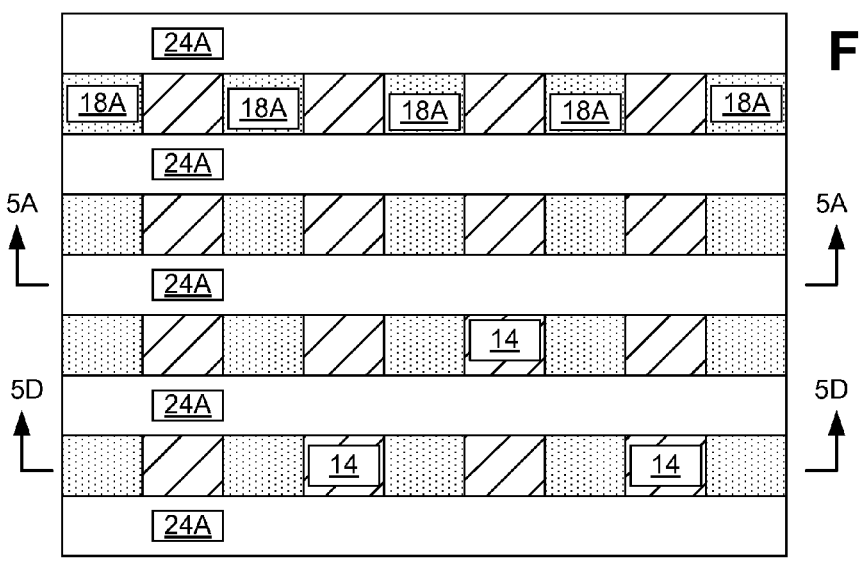
Figure 5D:
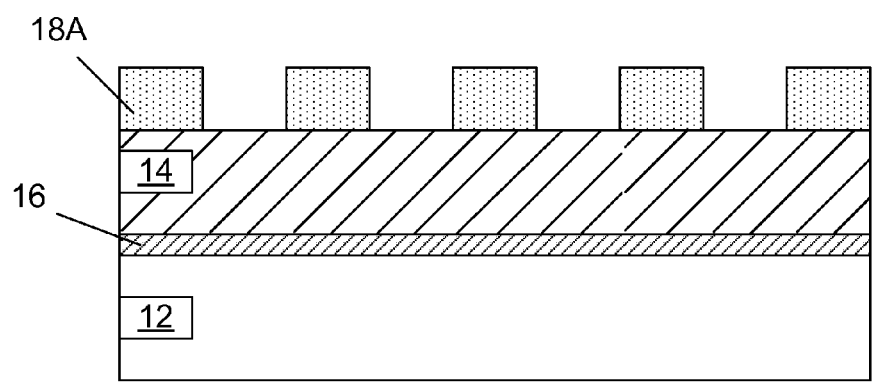

FIGS. 4A-4C depict the product after a second hard mask material layer 22 and a second patterned mask layer 24, comprised of a plurality of line-type features 24A, have been formed above the first patterned hard mask layer 18A. In the depicted example, the second hard mask material layer 22 is depicted as being a single layer of material. In practice, the second hard mask material layer 22 may be comprised of two or more layers of material depending upon the particular application. The second hard mask material layer 22 may be comprised of a material that exhibits good etch selectivity relative to the layer of insulating material 14 and the first patterned hard mask layer 18A. In one illustrative embodiment, the second hard mask material layer 22 may be comprised of, for example, amorphous carbon. The second hard mask material layer 22 may be formed by performing a variety of known processing techniques, such as CVD, ALD, etc., and its thickness may vary depending upon the particular application, e.g., 20-40 nm. In one illustrative embodiment, the second patterned mask layer 24 may be manufactured using the above-described directed self-assembly (DSA) process. Note that, in the depicted example, the second patterned mask layer 24 is formed such that its line-type features are oriented orthogonally relative to the line-type features in the first patterned hard mask layer 18A.

FIGS. 5A-5D depict the device 10 after an etching process has been performed through the second patterned mask layer 24 on the second hard mask material layer 22 to thereby define a second patterned hard mask layer 22A. As depicted, in this example, the second patterned hard mask layer 22A is comprised of a plurality of line-type features.

Figure 6A:
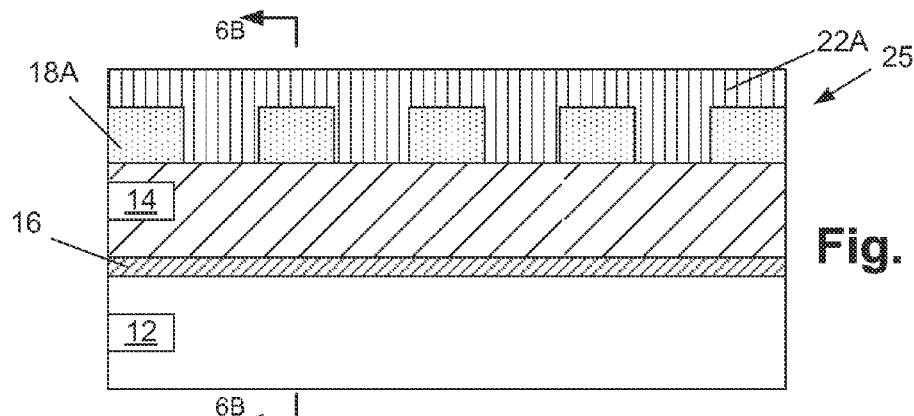
Figure 6B:
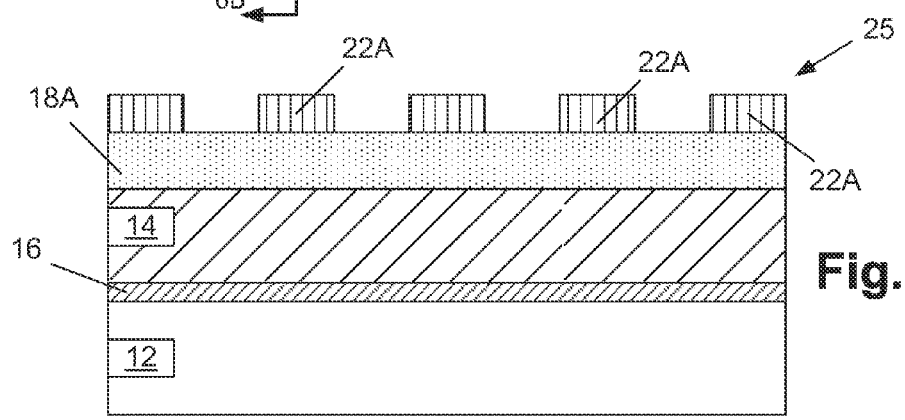
Figure 6C:
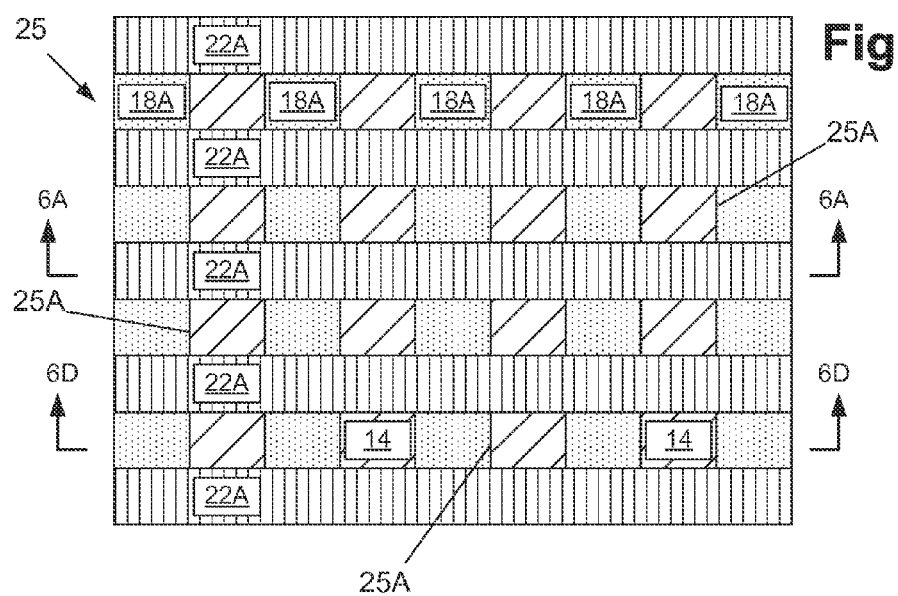
Figure 6D:
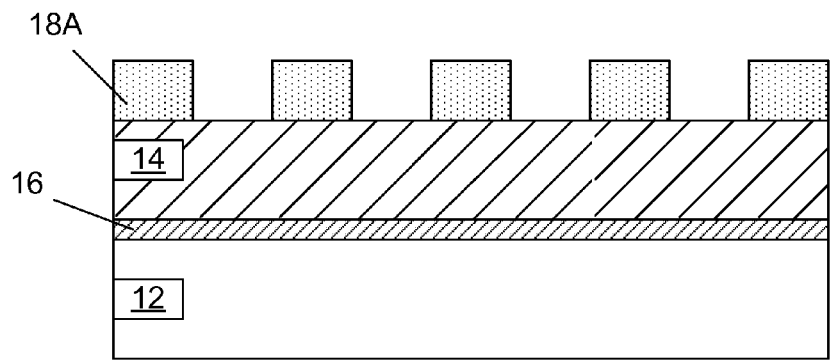
Figure 6E:
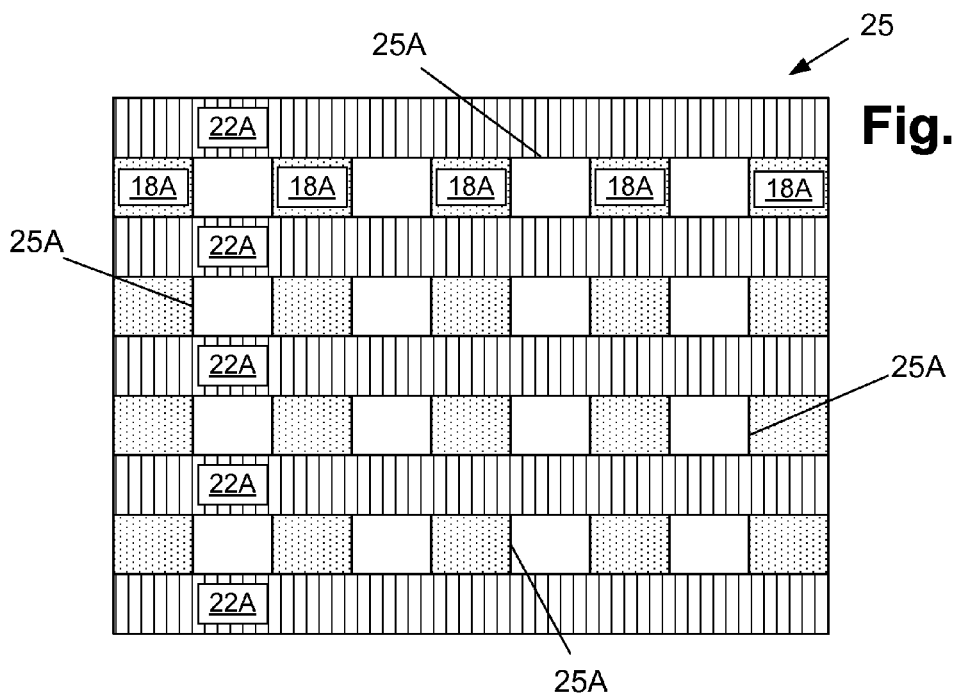
Figure 7A:
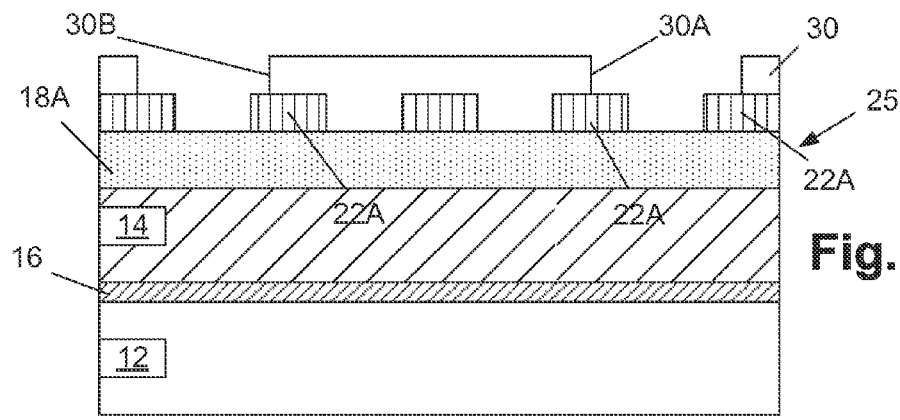
Figure 7B:
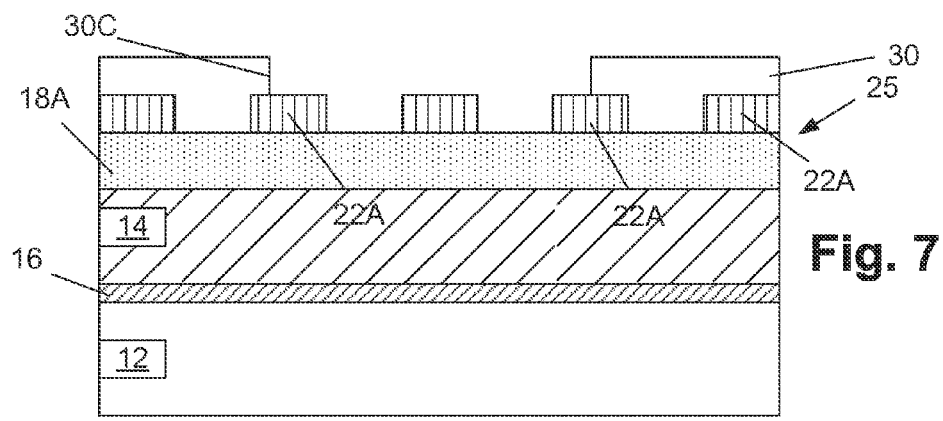
Figure 7C:
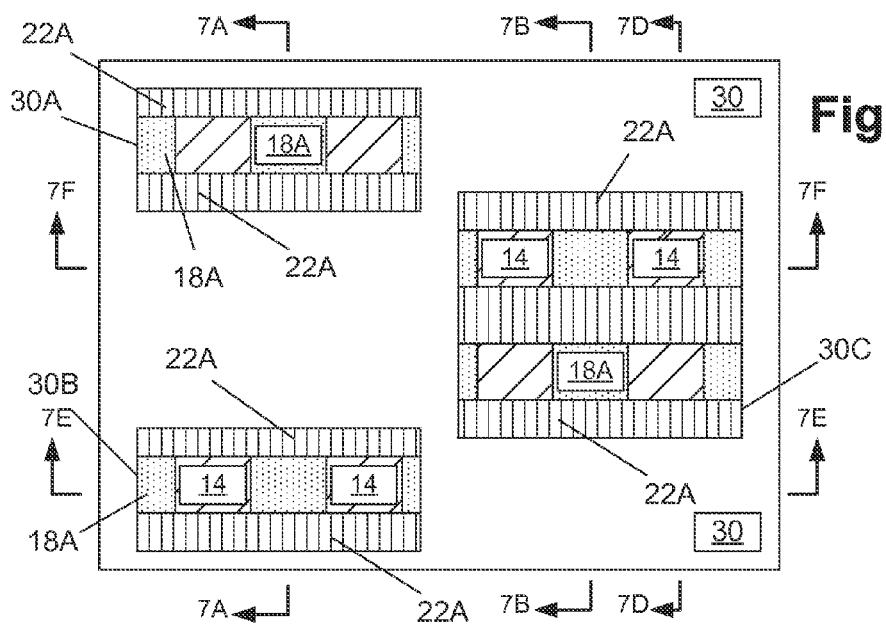
Figure 7D:
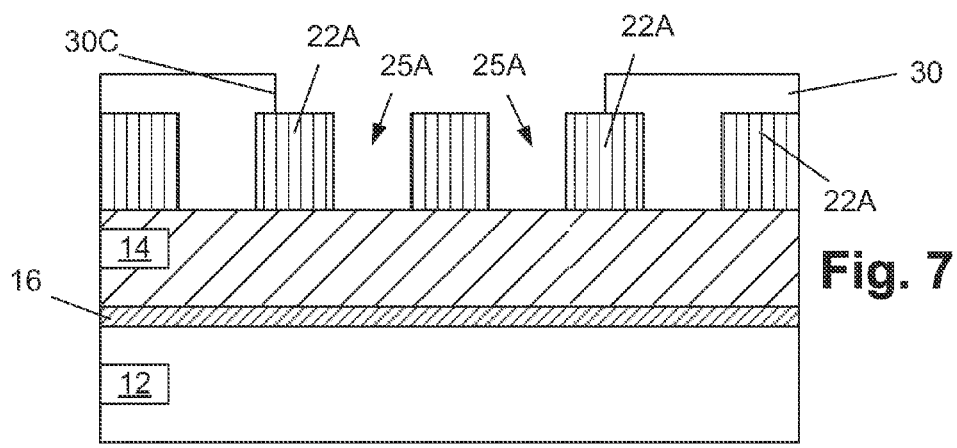
Figure 7E:
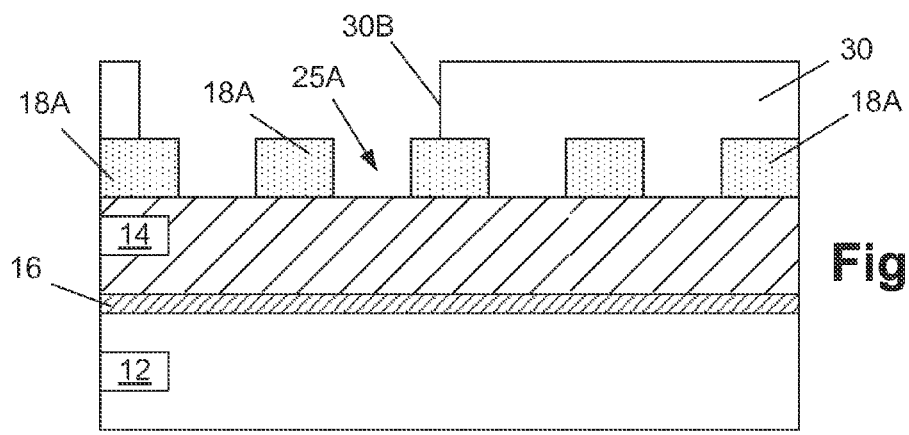
Figure 7F:
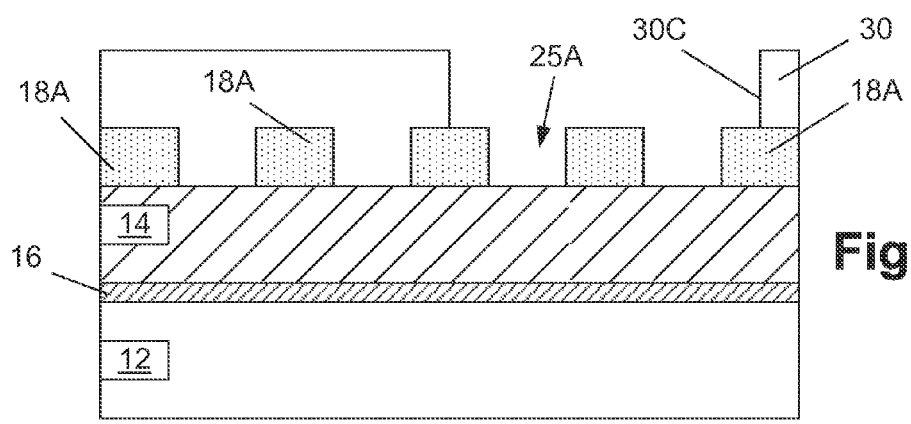
Figure 8A:
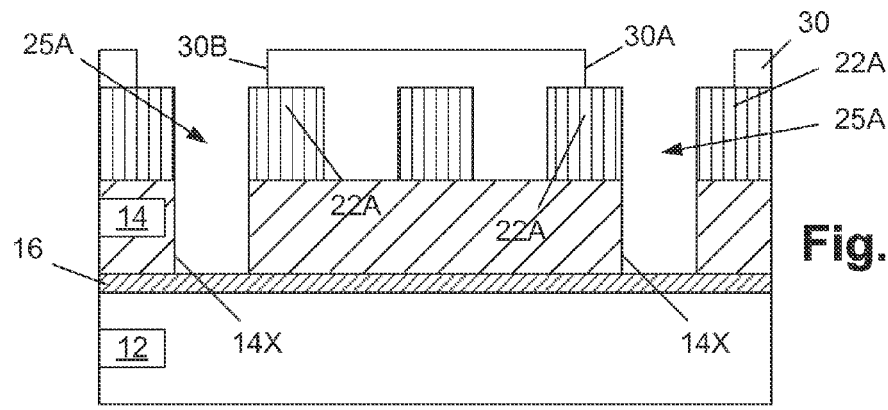
Figure 8B:
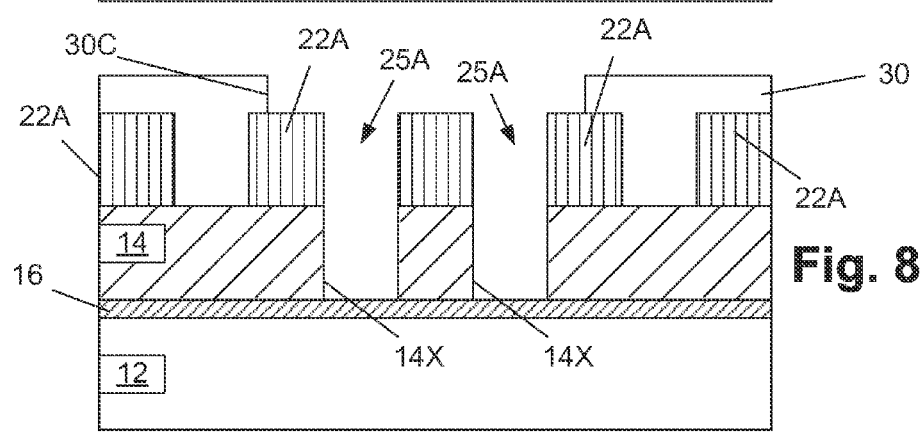
Figure 8C:
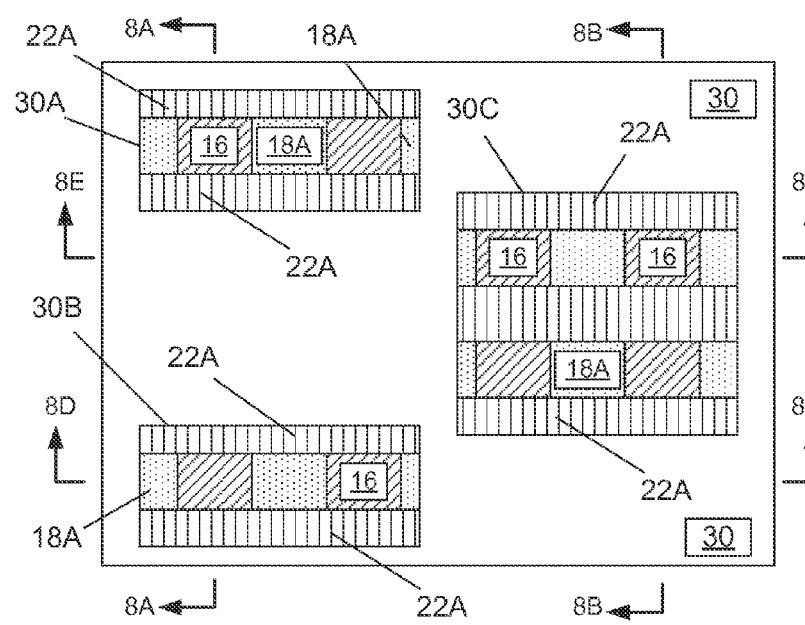
Figure 8D:
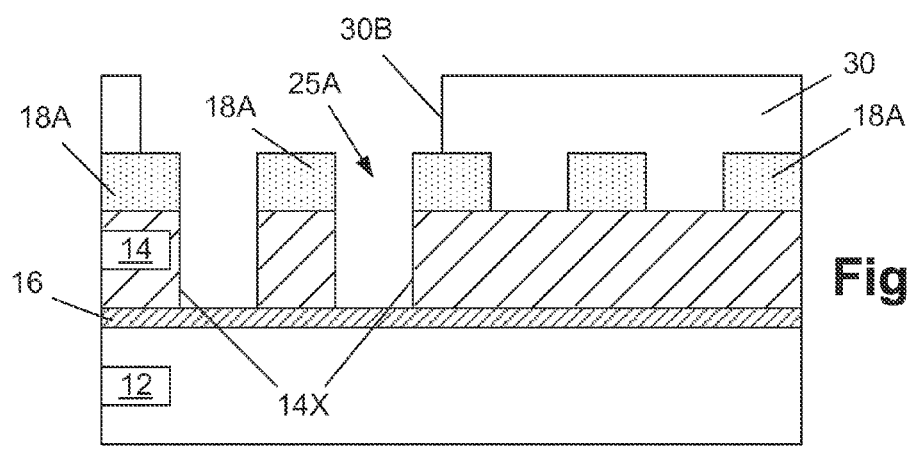
Figure 8E:
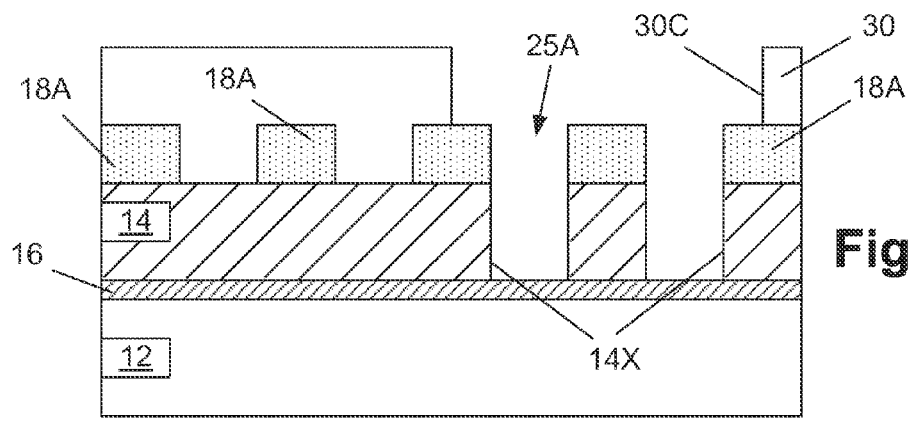
Figure 9A:
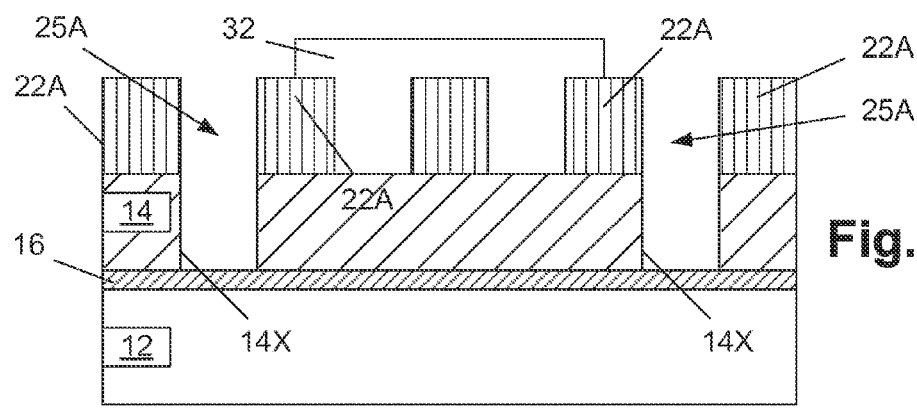
Figure 9B:
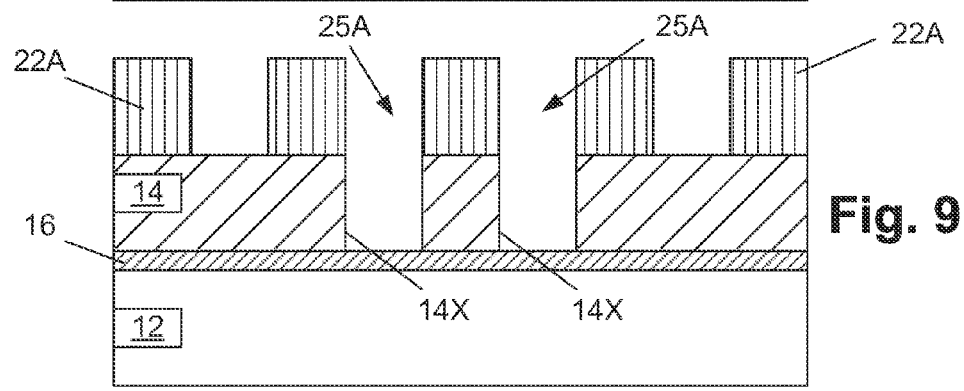
Figure 9C:
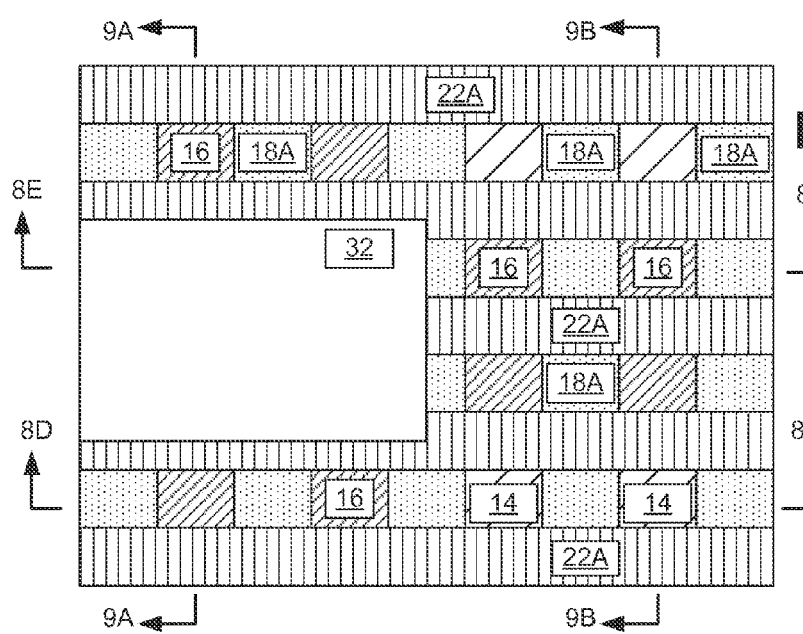
Figure 9D:
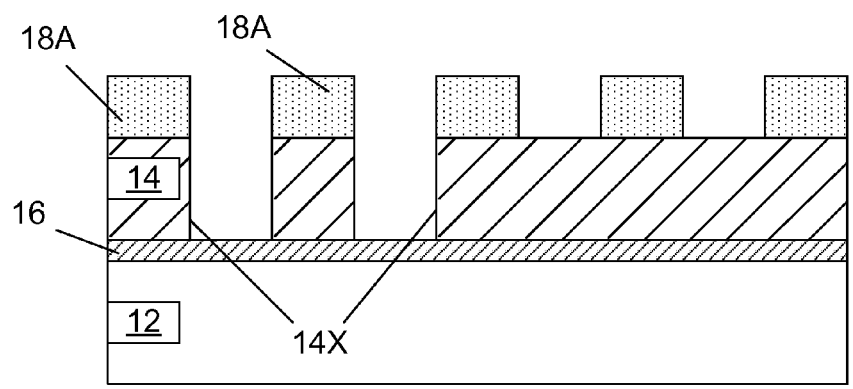
Figure 9E:
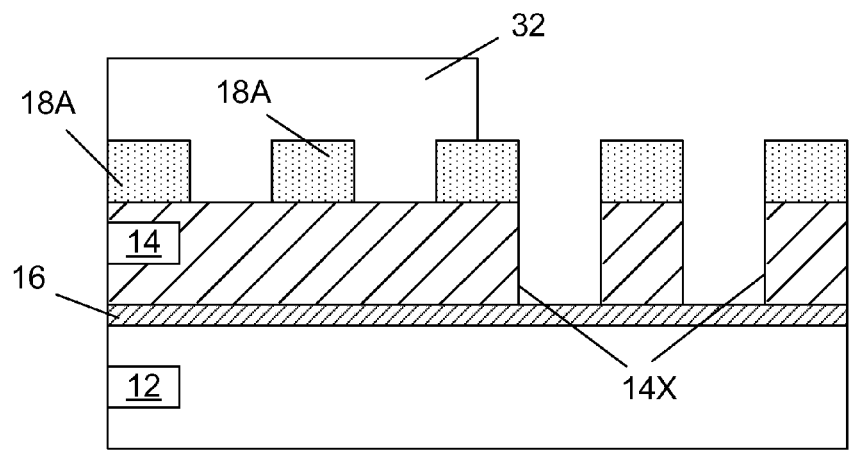
Figure 10A:
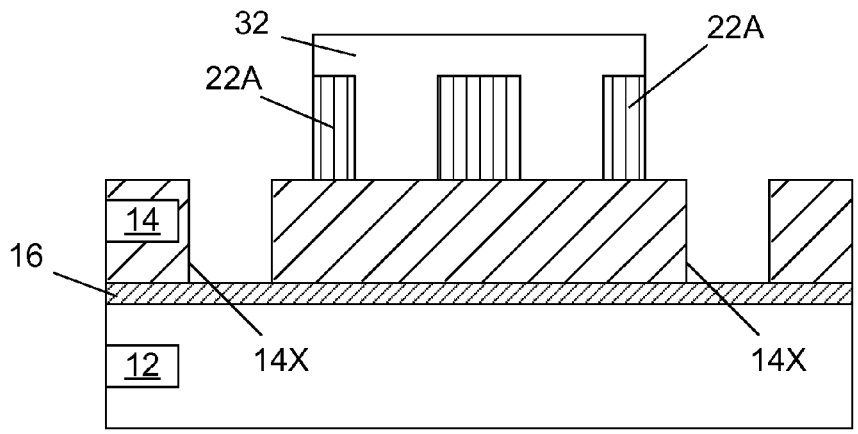
Figure 10B:
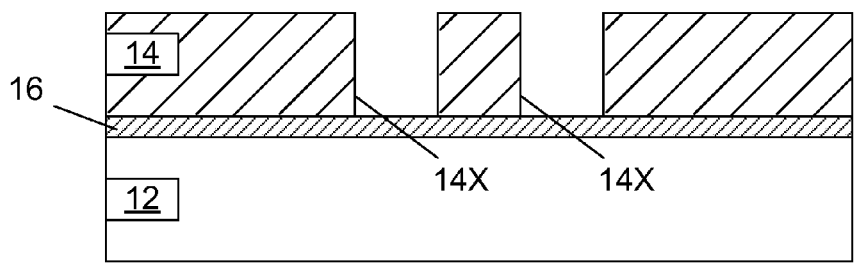
Figure 10C:
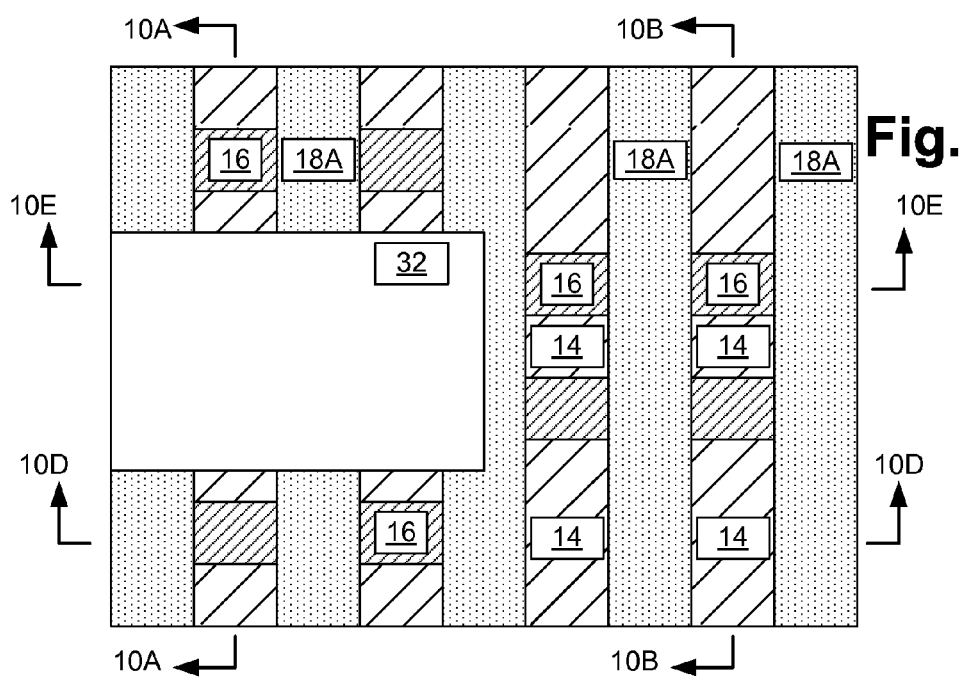
Figure 10D:
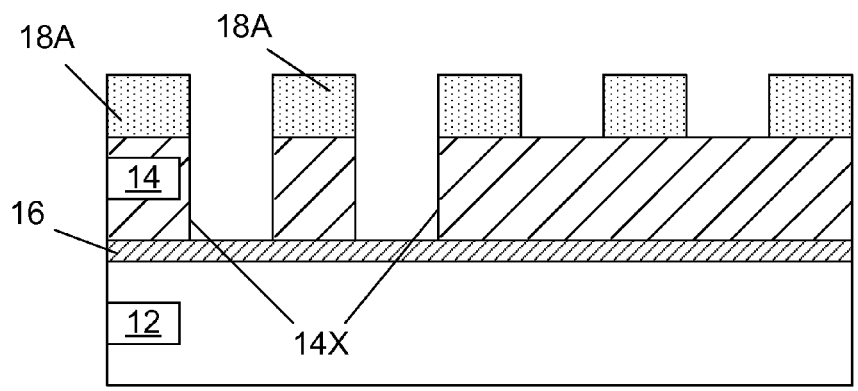
Figure 10E:
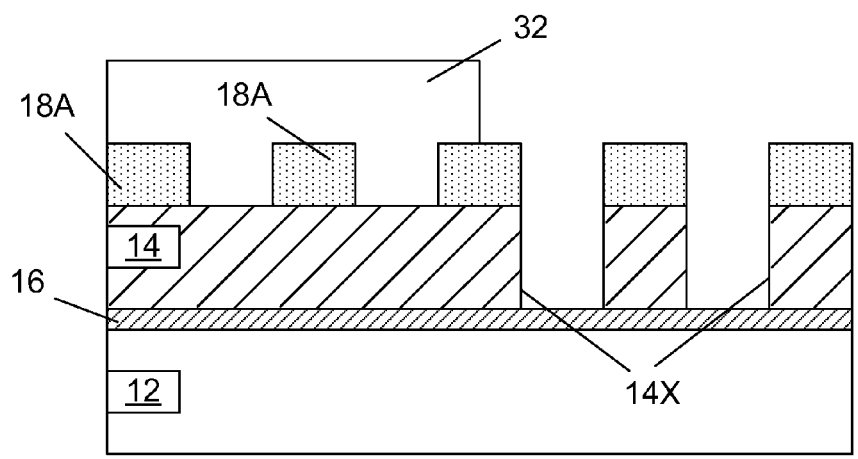
Figure 11A:
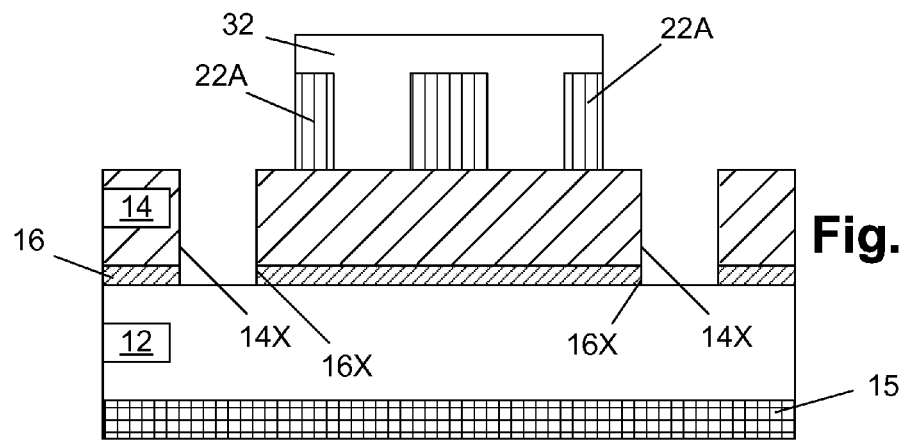
Figure 11B:
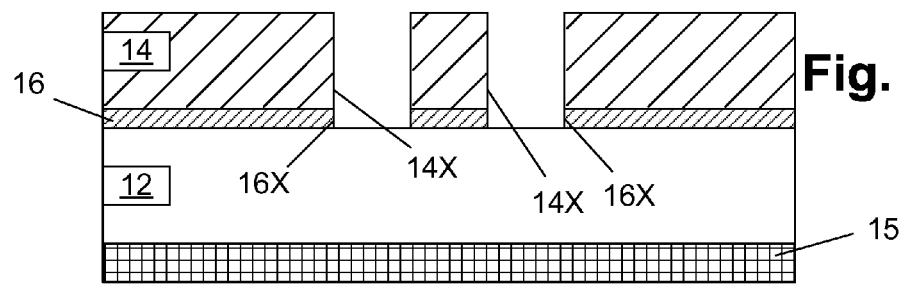
Figure 11C:
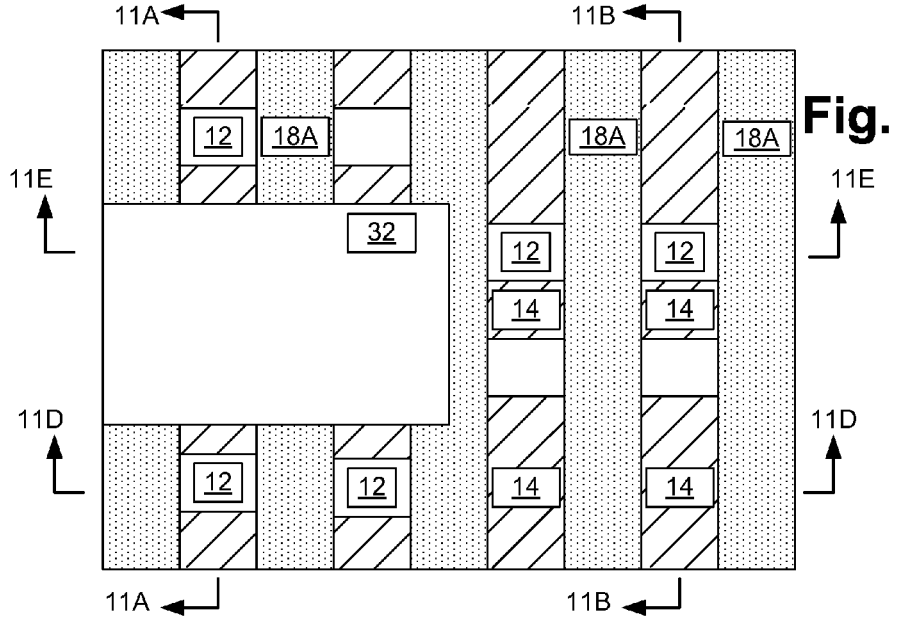
Figure 11D:
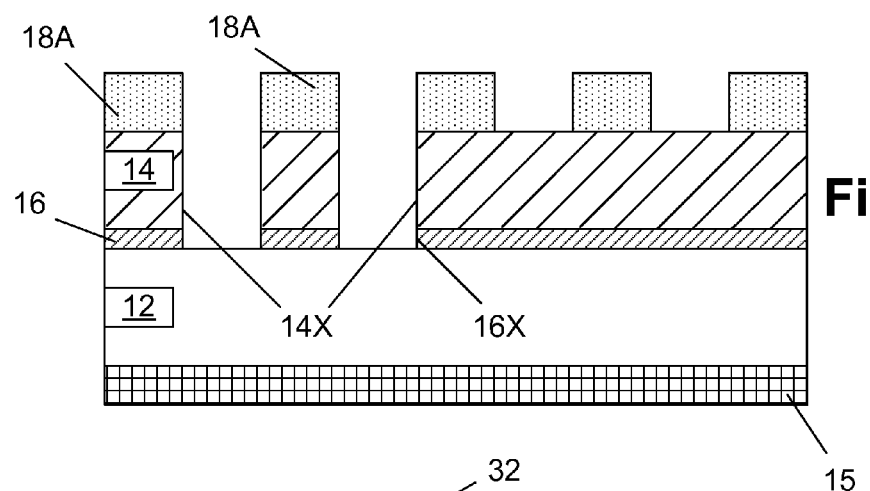
Figure 11E:
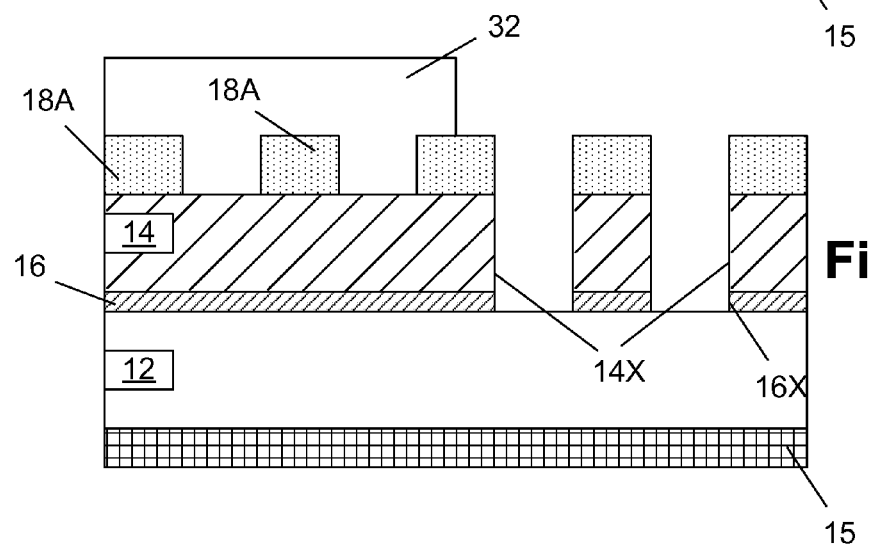
Figure 12A:
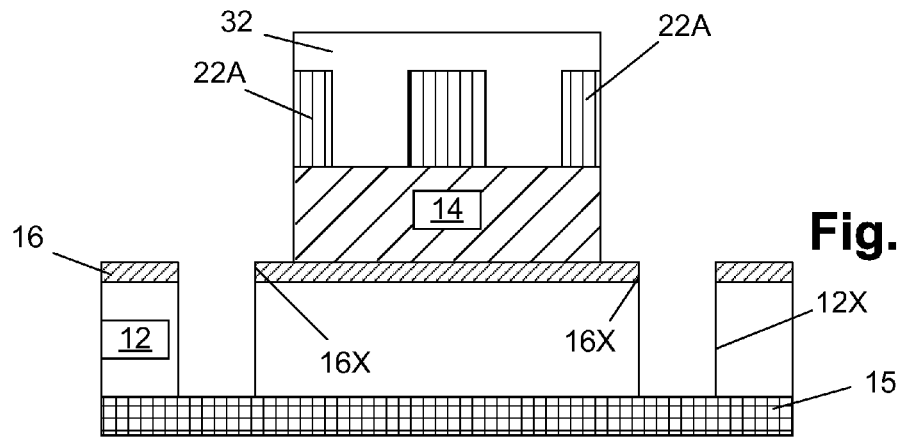
Figure 12B:
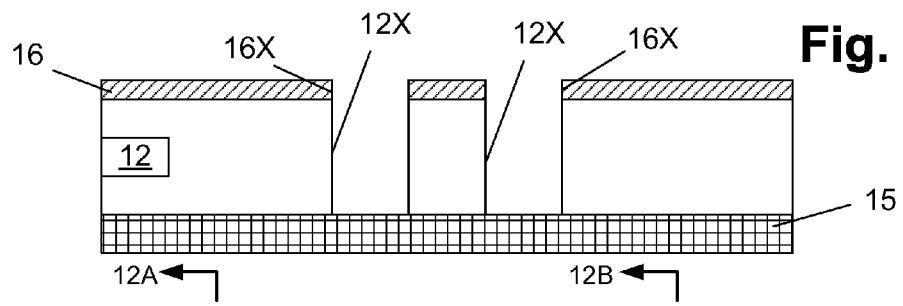
Figure 12C:
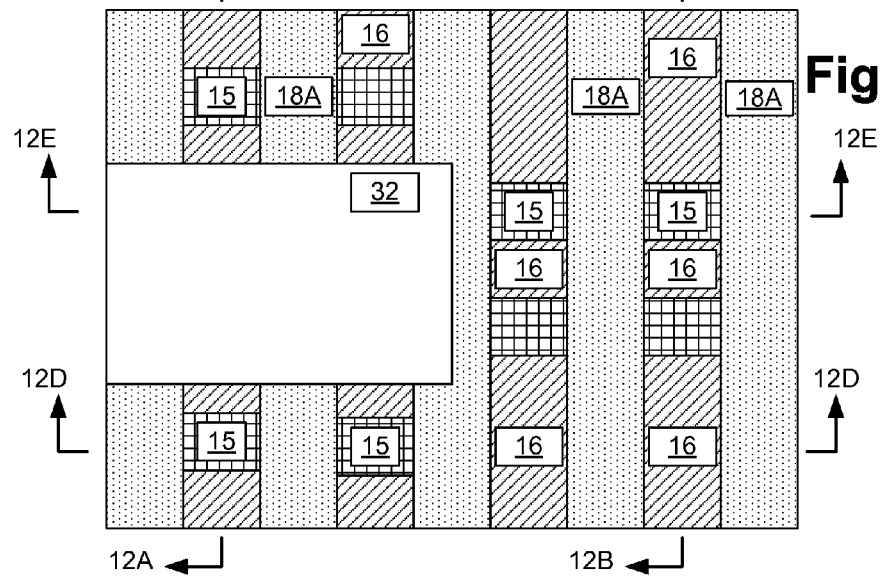
Figure 12D:
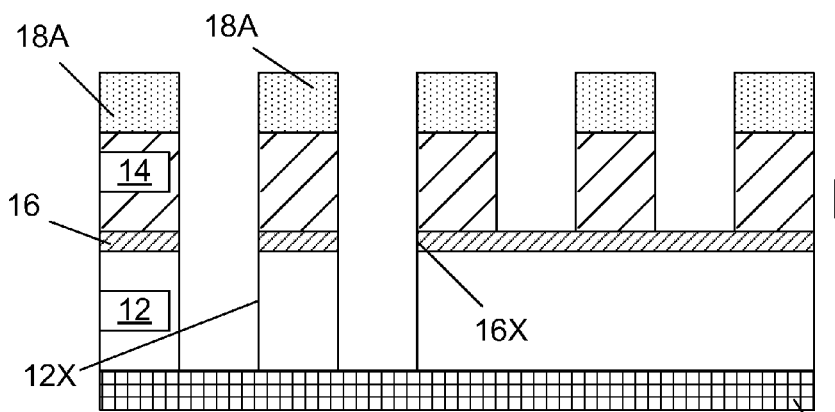
Figure 12E:
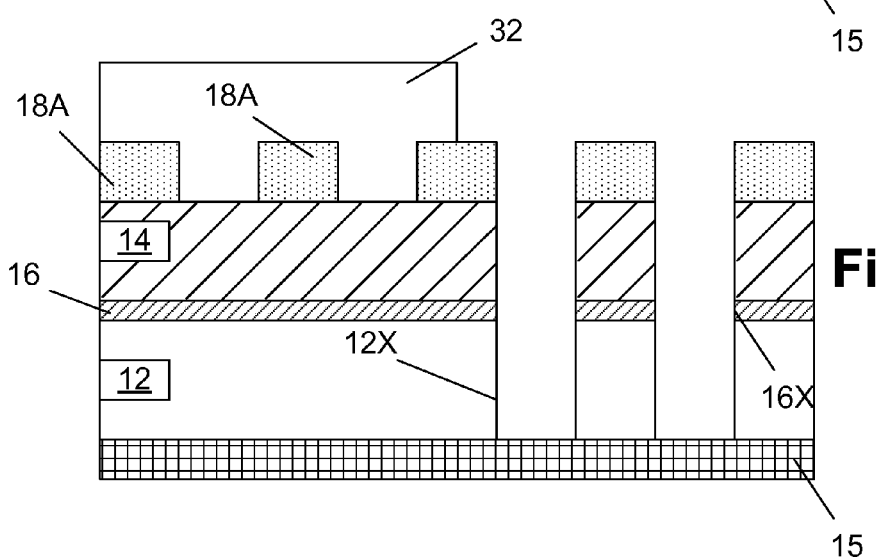
Figure 13A:
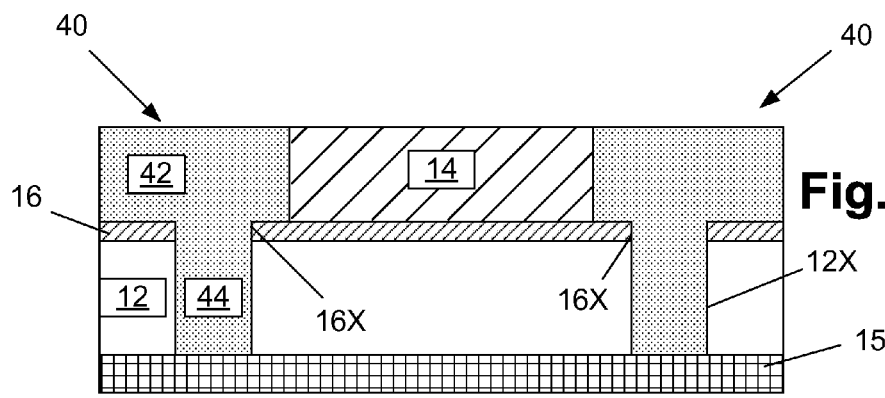
Figure 13B:
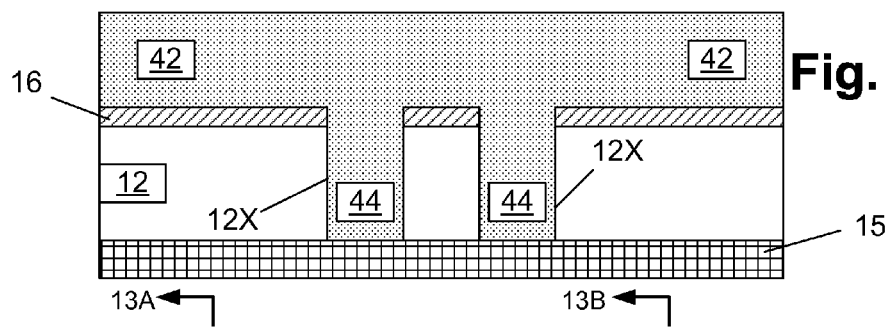
Figure 13C:
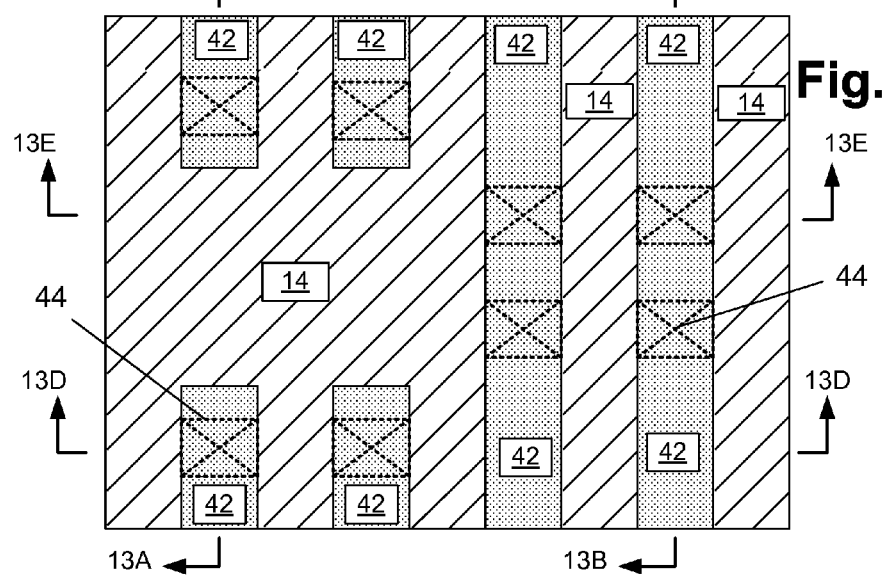
Figure 13D:
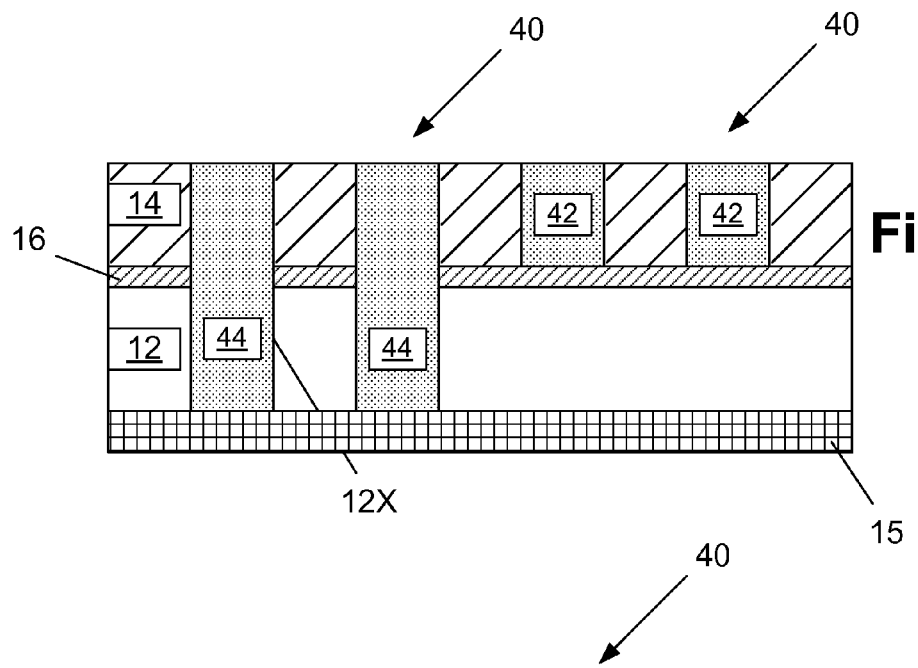
Figure 13E:
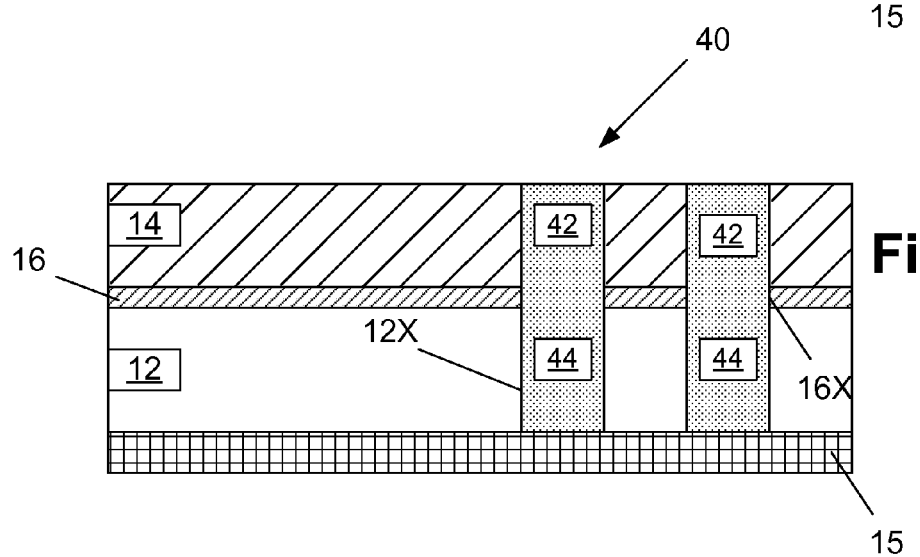

FIGS. 6A-6E depict the product 10 after the second patterned mask layer 24 has been removed. In one illustrative embodiment, the second patterned mask layer 24 may be removed by performing an oxygen-based plasma process. As can be seen in the figures, the first and second patterned hard mask layers 18A, 22A, considered collectively, now constitute a patterned hard mask layer 25 comprised of a plurality of discrete openings 25A that are defined by the intersecting line-type features of the first and second patterned hard mask layers 18A, 22A. In the depicted example, the line-type features are oriented approximately normal to one another. However, in other applications, the line-type features may be oriented non-orthogonally relative to each other, e.g., the line-type features may be oriented at an angle of approximately 60 degrees relative to one another. FIG. 6E is a plan view that depicts only the patterned hard mask layer 25 with all other layers of material removed. In the depicted example, the openings 25A have a generally rectangular configuration due to the relationship between the intersecting line-type features of the first and second patterned hard mask 18A, 22A. In some embodiments, the openings 25A may have a substantially square configuration. Of course, in describing the opening 25A using geometrically descriptive terms, it is not meant to imply that the openings 25A are formed to such precise geometric configurations. Rather, the use of such terms should be understood as the overall general configuration of such structures. The dimensions of the openings 25A may vary depending upon the application.

FIGS. 7A-7F depict the product 10 after a patterned etch mask 30, e.g., a patterned photoresist mask, has been formed above the patterned hard mask layer 25. Note that, in the depicted example, the patterned etch mask 30 is shown as a single layer of photoresist material, but it is understood that, in some applications, the patterned etch mask 30 might include two or more layers that include, for example, anti-reflection coatings, planarizing coatings, etch layers, etc. In the depicted example, the patterned etch mask 30 is comprised of illustrative openings 30A-C. In one embodiment, the patterned etch mask 30 may be formed using well-known photolithography tools and techniques. In general, the purpose of the patterned etch mask 30 is to cover some, but not all, of the discrete openings 25A in the patterned hard mask layer 25 such that the material underlying the patterned hard mask layer 25, e.g., the layer of insulating material 14 in the depicted example, may be etched through the exposed discrete openings 25A. Since the exposed openings 25A in the patterned hard mask layer 25 will ultimately define the size of any opening formed in an underlying material layer, the formation of the openings 30A-30C in the patterned etch mask 30 need not be as precise as would be the case if the patterned hard mask layer 25 described herein were not employed as a means to ultimately control the etching of the underlying layer of material. In the particular example wherein the inventions disclosed herein may be used to form conductive lines/vias/contacts on an integrated circuit product using a double damascene techniques, the openings 30A-30C are arranged so as to expose only those openings 25A in the patterned hard mask layer 25 that correspond to locations where a conductive via or contact will be formed.

FIGS. 8A-8E depict the product after an etching process has been performed on the layer of insulating material 14 using the patterned etch mask 30 and only the exposed portions of the patterned hard mask layer 25, i.e., the portions containing the exposed openings 25A, as an etch mask. In one embodiment, the etching process may be an anisotropic etching process that stops on the etch stop layer 16 and thereby defines a plurality of openings 14X in the layer of insulating material 14.

FIGS. 9A-9E depict the product 10 after several process operations were performed. First, the patterned etch mask 30 was removed and another patterned etch mask 32, e.g., a patterned photoresist mask, was formed above the patterned hard mask layer 25. In one embodiment, the patterned etch mask 32 may be formed using well-known photolithography tools and techniques. In the particular example wherein the inventions disclosed herein may be used to form conductive lines/vias/contacts on an integrated circuit product using a double damascene techniques, the patterned etch mask 32 is configured so as to cover portions of the layer of insulating material 14 where metal lines are not to be formed. In general, using the novel methods disclosed herein in a dual-damascene application, conductive metal lines will be formed in trenches formed in the layer of insulating material 14, while connecting conductive vias/contacts will extend through openings formed in the layer of insulating material 12, as described more fully below.

FIGS. 10A-10E depict the product 10 after portions of the second patterned hard mask layer 22A not protected by the patterned etch mask 32 were removed by performing an etching process.

FIGS. 11A-11E depict the product 10 after another etching process has been performed to remove the portions of the etch stop layer 16 exposed by the formation of the openings 14X in the layer of insulating material 14. In one embodiment, the etching process may be an anisotropic etching process that stops on the underlying layer of insulating material 12 and thereby defines a plurality of openings 16X in the etch stop layer 16. This etching process exposes portions of the layer of insulating material 12 within the openings 14X, 16X. Note that this etching process is performed through the patterned etch mask 32 and the portions of the first patterned hard mask layer 18A that are not covered by the patterned mask layer 32. Also depicted in FIGS. 11A-11E is a generic layer or structure 15 that has been added to facilitate explanation of the present invention in the context of forming conductive structures on an integrated circuit product using a dual-damascene technique. The layer or structure 15 is intended to be representative of any type of structure that may be encountered in manufacturing integrated circuit products. For example, the structure 15 may represent an uppermost layer of an underlying metallization layer or it may represent a semiconductor device.

FIGS. 12A-12E depict the product 10 after another etching process has been performed to remove the exposed portions of the layer of insulating material 14 and to remove exposed portions of the layer of insulating material 12 exposed by the formation of the openings 16X in the etch stop layer 16. As the etching process progresses, the exposed portions of the layer of insulating material 14 are consumed to define trenches where conductive metal lines will be formed and the exposed portions of the layer of insulating material 12 are consumed to define openings 12X where connecting conductive vias/contacts will be formed. This etching process exposes portions of the layer or structure 15 within the openings 12X.

FIGS. 13A-13E depict the product 10 after several process operations were performed. First, the patterned etch mask 32 was removed, as well as the remaining portions of the patterned hard mask layer 25 (i.e., the first and second patterned hard mask layers 18A, 22A). Thereafter, using known processing tool and techniques, a plurality of conductive structures 40 were formed in the various openings in the layers of insulating material 12, 14. In one illustrative embodiment, the conductive structures 40 are comprised of a plurality of conductive lines 42 that are conductively coupled to contact/vias 44. The conductive structures 40 depicted in FIGS. 13A-13E are intended to be representative in nature as they may represent any type of conductive feature or structure on an integrated circuit product. In the depicted example, the conductive structures 40 do not include one or more barrier/adhesion layers which would typically be present in a real-world device. The conductive structures described and discussed herein may be made of any type of conductive material, e.g., a metal or a metal alloy, such as copper or a copper-based material. In general, the conductive structures 40 may be formed by performing one or more deposition processes to deposit one or more layers of barrier materials and or seed layers, e.g., a copper seed layer, above the product 10 and in the openings 12X, 14X, and performing a bulk deposition process to overfill the openings with additional conductive material, such as bulk copper formed by performing an electroplating or an electroless deposition process. Thereafter, the product 10 may be subjected to one or more CMP processes using techniques to remove excess conductive material positioned outside of the openings 14X. These process operations result in the illustrative conductive structures 40 shown in FIGS. 13A-13E.

As should be clear from the foregoing, the novel methods disclosed herein provide an efficient and effective means of forming conductive structures in integrated circuit products that may solve or at least reduce some of the problems identified in the background section of this application. Note that the use of terms such as "first," "second," "third" or "fourth" to describe various etching processes and/or masking layers in this specification and in the attached claims is only used as a shorthand reference to such etching steps and does not necessarily imply that such etching steps are performed in that ordered sequence. Of course, depending upon the exact claim language, an ordered sequence of such etching processes may or may not be required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a patterned hard mask layer comprised of a plurality of discrete openings above a structure, wherein said patterned hard mask layer is comprised of a plurality of intersecting line-type features;
   forming a first patterned etch mask above said patterned hard mask layer that exposes at least one, but not all, of said plurality of discrete openings;
   performing a first etching process through said first patterned etch mask layer and said at least one exposed opening in said patterned hard mask layer to define an opening in a layer of insulating material formed above said structure;
   after defining said opening in said layer of insulating material, forming a second patterned etch mask above said patterned hard mask layer that exposes at least one, but not all, of said plurality of discrete openings; and
   performing at least one second etching process through said second patterned etch mask to define a trench in said layer of insulating material and an opening in said structure.

2. The method of claim 1, wherein said structure is a second layer of insulating material.

3. The method of claim 1, wherein said intersecting line-type features are formed by performing a plurality of directed self-assembly process operations.

4. The method of claim 1, wherein at least some of said intersecting line-type features are formed by performing a directed self-assembly process operation.

5. The method of claim 1, wherein said intersecting line-type features intersect one another at an angle of approximately ninety degrees.

6. The method of claim 1, wherein said intersecting line-type features intersect one another at a non-orthogonal angle.

7. The method of claim 1, wherein said discrete openings have a substantially rectangular configuration.

8. The method of claim 1, wherein said patterned hard mask layer is comprised of a first plurality of line-type features that intersect a second plurality of line-type features, wherein said first plurality of line-type features and said second plurality of line-type features are made of different materials.

9. A method, comprising:
forming a patterned hard mask layer above a structure, wherein said patterned hard mask layer is comprised of a first plurality of line-type features that intersect a second plurality of line-type features to thereby define a plurality of discrete openings, and wherein said first plurality of line-type features and said second plurality of line-type features are made of different materials;
forming a first patterned etch mask above said patterned hard mask layer that exposes at least one, but not all, of said plurality of discrete openings;
performing a first etching process through said first patterned etch mask and said at least one exposed opening in said patterned hard mask layer to define an opening in a layer of insulating material formed above said structure and to expose an etch stop layer formed between said layer of insulating material and said structure;
removing said first patterned etch mask;
after removing said first patterned etch mask, forming a second patterned etch mask above said patterned hard mask layer that exposes at least one, but not all, of said plurality of discrete openings;
removing at least some portions of said patterned hard mask layer exposed by said second patterned etch mask; and
performing at least one second etching process through said second patterned etch mask to define a trench in said layer of insulating material and an opening extending through said etch stop layer and into said structure.

10. The method of claim 9, wherein said intersecting line-type features intersect one another at an angle of approximately ninety degrees.

11. The method of claim 9, wherein said intersecting line-type features intersect one another at a non-orthogonal angle.

12. The method of claim 9, wherein said discrete openings have a substantially rectangular configuration.

13. The method of claim 9, wherein at least some of said intersecting line-type features are formed by performing a directed self-assembly process operation.

14. A method, comprising:
forming a patterned hard mask layer above a structure, said patterned hard mask layer comprised of a plurality of intersecting line-type features that define a plurality of discrete openings that have a substantially rectangular configuration, wherein forming said patterned hard mask layer comprises forming a first patterned hard mask layer comprising a first plurality of line-type features and thereafter forming a second patterned hard mask layer comprising a second plurality of line-type features above said first patterned hard mask layer, said second plurality of line-type features intersecting said first plurality of line-type features, said first and second patterned hard mask layers being made of different materials;
forming a first patterned etch mask above said patterned hard mask layer that exposes at least one, but not all, of said plurality of discrete openings;
performing a first etching process through said first patterned etch mask and said at least one exposed opening in said patterned hard mask layer to define at least one opening in a layer of insulating material formed above said structure;
removing said first patterned etch mask;
after removing said first patterned etch mask, forming a second patterned etch mask above said patterned hard mask layer that exposes at least one, but not all, of said plurality of discrete openings;
performing a second etching process to remove portions of said second patterned etch mask layer that are exposed by said second patterned etch mask layer; and
performing at least one third etching process through said second patterned etch mask to define at least one trench in said layer of insulating material and at least one opening in said structure.

15. The method of claim 14, wherein said intersecting line-type features intersect one another at an angle of approximately ninety degrees.

16. The method of claim 14, wherein at least some of said intersecting line-type features are formed by performing a directed self-assembly process operation.

17. A method, comprising:
forming a first layer of insulating material;
forming an etch stop layer above said first layer of insulating material;
forming a second layer of insulating material above said etch stop layer;
forming a patterned hard mask layer comprised of a plurality of discrete openings above said second layer of insulating material;
forming a first patterned etch mask above said patterned hard mask layer that exposes at least one, but not all, of said plurality of discrete openings;
performing at least one first etching process through said patterned etch mask and said at least one exposed opening in said patterned mask layer to define an opening in said second layer of insulating material, wherein said opening in said second layer of insulating material exposes said etch stop layer;
removing said first patterned etch mask;
forming a second patterned etch mask above said patterned hard mask layer that exposes at least one, but not all, of said plurality of discrete openings;
performing at least one second etching process to remove portions of said patterned hard mask layer;
after performing said at least one second etching process, performing at least one third etching process to remove exposed portions of said etch stop layer and thereby expose portions of said first layer of insulating material;
performing at least one fourth etching process to remove exposed portions of said first and second layers of insulating material to thereby define at least one trench in said second layer of insulating material and at least one opening in said first layer of insulating material; and
forming a conductive structure in each of said at least one trench and said at least one opening.

18. The method of claim 17, wherein said first and second layers of insulating material are comprised of silicon dioxide or a low-k insulating material.

19. The method of claim 17, wherein said patterned hard mask layer is comprised of a plurality of intersecting line-type features.

20. The method of claim 17, wherein said intersecting line-type features intersect one another at an angle of approximately ninety degrees.

21. The method of claim 17, wherein said intersecting line-type features intersect one another at a non-orthogonal angle.

22. The method of claim 17, wherein said discrete openings have a substantially rectangular configuration.

23. The method of claim 17, wherein said patterned hard mask layer is comprised of a first plurality of line-type features that intersect a second plurality of line-type features, wherein said first plurality of line-type features and said second plurality of line-type features are made of different materials.

24. The method of claim 19, wherein said intersecting line-type features are formed by performing a plurality of directed self-assembly process operations.

25. The method of claim 19, wherein at least some of said intersecting line-type features are formed by performing a directed self-assembly process operation.

26. The method of claim 1, wherein performing said at least one second etching process through said second patterned etch mask layer comprises removing at least a portion of said patterned hard mask layer exposed by said second patterned etch mask layer.

27. The method of claim 1, wherein defining said opening in said structure comprises etching through an etch stop layer formed between said structure and said layer of insulating material.

28. The method of claim 14, wherein defining said at least one opening in said structure comprises etching through an etch stop layer formed between said structure and said layer of insulating material.

* * * * *